(12) United States Patent
Mori

(10) Patent No.: US 10,192,929 B2
(45) Date of Patent: Jan. 29, 2019

(54) THREE-DIMENSIONAL MEMORY DEVICES HAVING THROUGH-STACK CONTACT VIA STRUCTURES AND METHOD OF MAKING THEREOF

(71) Applicant: SANDISK TECHNOLOGIES LLC, Plano, TX (US)

(72) Inventor: Yoshio Mori, Yokkaichi (JP)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 15/468,519

(22) Filed: Mar. 24, 2017

(65) Prior Publication Data

US 2018/0277596 A1   Sep. 27, 2018

(51) Int. Cl.
*H01L 27/11556* (2017.01)
*H01L 27/24* (2006.01)
(Continued)

(52) U.S. Cl.
CPC ...... *H01L 27/249* (2013.01); *H01L 27/11553* (2013.01); *H01L 27/11556* (2013.01);
(Continued)

(58) Field of Classification Search
CPC ......... H01L 27/11556; H01L 27/11553; H01L 27/249
See application file for complete search history.

(56) References Cited

U.S. PATENT DOCUMENTS

| 5,915,167 | A | 6/1999 | Leedy |
| 8,633,099 | B1 | 1/2014 | Shih et al. |

(Continued)

FOREIGN PATENT DOCUMENTS

| KR | 20140000719 A | 1/2014 |
| WO | WO 2007/004843 A1 | 1/2007 |

(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.

(Continued)

*Primary Examiner* — Asok K Sarkar
*Assistant Examiner* — Grant Withers
(74) *Attorney, Agent, or Firm* — The Marbury Law Group PLLC

(57) ABSTRACT

A three-dimensional memory device includes conductive structures located over a substrate, an alternating stack of insulating layers and electrically conductive layers formed over the conductive structures, and an array of memory structures formed through the alternating stack. Each of the memory structures includes memory elements located at levels of the electrically conductive layers. A contact region can be formed on the alternating stack. Two-stage contact via cavities having a greater width above a top surface of a respective electrically conductive layer and having a narrower width through the alternating stack can be formed in the contact region. Upper insulating spacers and lower insulating spacers are formed such that annular surfaces of the respective electrically conductive layer are physically exposed. Two-stage contact via structures can provide electrical contact between the electrically conductive layers and the conductive structures.

15 Claims, 35 Drawing Sheets

(51) Int. Cl.
*H01L 45/00* (2006.01)
*H01L 27/11582* (2017.01)
*H01L 27/11553* (2017.01)

(52) U.S. Cl.
CPC .... *H01L 27/11582* (2013.01); *H01L 45/1233* (2013.01); *H01L 45/1608* (2013.01)

(56) References Cited

U.S. PATENT DOCUMENTS

| | | |
|---|---|---|
| 8,828,884 B2 | 9/2014 | Lee et al. |
| 9,397,115 B1 | 7/2016 | Nozawa |
| 9,412,753 B2 | 8/2016 | Izumi et al. |
| 9,437,658 B2 | 9/2016 | Sakotsubo |
| 9,449,924 B2 | 9/2016 | Takaki |
| 9,502,429 B2 | 11/2016 | Hironaga |
| 9,515,023 B2 | 12/2016 | Tobitsuka et al. |
| 9,524,901 B2 | 12/2016 | Izumi et al. |
| 9,530,787 B2 | 12/2016 | Tsutsumi et al. |
| 9,583,539 B2 | 2/2017 | Takaki |
| 9,583,615 B2 | 2/2017 | Chen et al. |
| 9,853,038 B1* | 12/2017 | Cui ................... H01L 27/11556 |
| 2012/0306090 A1* | 12/2012 | Smith ............... H01L 27/11548 257/773 |
| 2013/0043455 A1 | 2/2013 | Bateman |
| 2014/0021632 A1* | 1/2014 | Lee ....................... G11C 5/063 257/774 |
| 2015/0036407 A1 | 2/2015 | Nakajima |
| 2015/0069499 A1 | 3/2015 | Nakaki |
| 2015/0372005 A1* | 12/2015 | Yon ................... H01L 27/11582 257/5 |
| 2016/0148835 A1 | 5/2016 | Shimabukuro et al. |
| 2016/0204122 A1* | 7/2016 | Shoji ................. H01L 27/11582 257/324 |
| 2016/0240555 A1* | 8/2016 | Lee ..................... H01L 23/5226 |
| 2016/0268291 A1* | 9/2016 | Ishimura ........... H01L 27/11582 |
| 2017/0323900 A1* | 11/2017 | Kanamori ......... H01L 27/11582 |

FOREIGN PATENT DOCUMENTS

| | | |
|---|---|---|
| WO | WO2012166451 A2 | 12/2012 |
| WO | WO2014036294 A1 | 3/2014 |

OTHER PUBLICATIONS

U.S. Appl. No. 15/228,216, filed Aug. 4, 2016, Chen et al.
U.S. Appl. No. 15/251,374, filed Aug. 30, 2016, Mada et al.
U.S. Appl. No. 15/299,919, filed Oct. 21, 2016, Wu et al.
U.S. Appl. No. 15/367,791, filed Dec. 2, 2016, Sano et al.
U.S. Appl. No. 15/400,244, filed Jan. 6, 2017, Ratnam et al.
U.S. Appl. No. 15/411,126, filed Jan. 20, 2017, Cui et al.
Invitation to Pay Additional Fees, Where Applicable, Protest Fee from the International Searching Authority for International Patent Application No. PCT/US2017/063685, dated Feb. 15, 2018, 17 pages.
International Search Report and Written Opinion of the International Searching Authority for International Patent Application No. PCT/US2017/063685, dated Apr. 11, 2018, 21 pages.

* cited by examiner

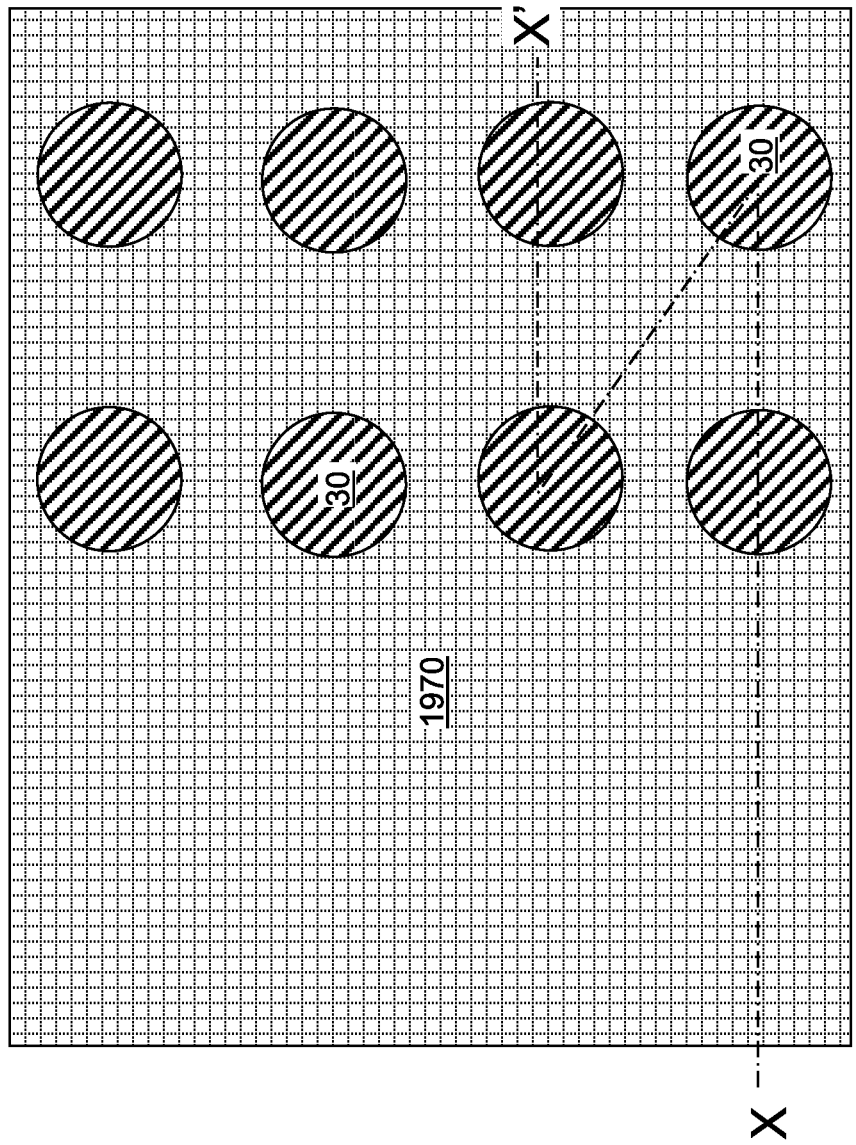

THREE-DIMENSIONAL MEMORY DEVICES HAVING THROUGH-STACK CONTACT VIA STRUCTURES AND METHOD OF MAKING THEREOF

FIELD

The present disclosure relates generally to the field of semiconductor devices and specifically to a three-dimensional memory devices containing through-stack contact via structures located in a contact region and methods of making the same.

BACKGROUND

Three-dimensional memory devices provide high density memory for modern electronic devices. Examples of three-dimensional memory devices include three-dimensional NAND memory devices and Resistance Random Access Memory (ReRAM) devices.

Three-dimensional vertical NAND strings having one bit per cell for a three-dimensional NAND memory device are disclosed in an article by T. Endoh et al., titled "Novel Ultra High Density Memory With A Stacked-Surrounding Gate Transistor (S-SGT) Structured Cell", IEDM Proc. (2001) 33-36. In a three-dimensional vertical NAND memory device, data is stored as presence or absence of trapped electrical charges in a vertical string of memory elements, which may be portions of a continuous charge trapping material layer or discrete floating gate electrodes. Electrically conductive layers can be provided at each level of the memory elements, and can function as word lines. A semiconductor channel and a tunneling dielectric can be provided adjacent to the vertical string of memory elements to program, and to read, the stored electrical charges in the vertical string of memory elements.

A ReRAM is a non-volatile memory device employing reversible change in resistance in a thin film with application of electrical voltage bias across the film. Application of the electrical voltage bias in one manner can cause decrease in the resistance of the thin film, for example, by formation of filaments that function as leakage current paths or by increasing a crystallinity of the thin film. Application of a different type of electrical voltage bias can cause reversal of the resistance of the thin film to an original high-resistance state, such as by removal of the filaments from the thin film or by decreasing the crystallinity of the thin film. Thus, data can be stored in a ReRAM cell by changing the resistance of the thin film, which can be a solid-state material. The thin film is referred to as a memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman.

A barrier modulated cell (BMC) resistive random access memory (ReRAM) device is a ReRAM in which the resistance of a memory element is modulated by separation or recombination of oxygen vacancies and interstitial oxygen ions. When the interstitial oxygen ions combine with the oxygen vacancies, a zone with a low density of charge carriers is formed due to elimination of oxygen vacancies, thereby increasing the resistance of the memory element. This operation is herein referred to as a "resetting" operation. When the oxygen ions are separated from the oxygen vacancies, a zone with a high density of charge carriers is formed due to the presence of vacancies, thereby decreasing the resistance of the memory element. This operation is herein referred to as a "setting" operation.

SUMMARY

According to an aspect of the present disclosure, a three-dimensional memory device is provided, which comprises: an alternating stack of insulating layers and electrically conductive layers located over a substrate; an array of memory structures vertically extending through the alternating stack, wherein each of the memory structures includes a vertical stack of memory elements located at levels of the electrically conductive layers; conductive structures located between the substrate and the alternating stack; and conductive via structures, wherein each conductive via structure contacts a top surface of a respective one of the electrically conductive layers and a top surface of a respective one of the conductive structures, and is electrically insulated from a respective subset of the electrically conductive layers that is located between the respective one of the electrically conductive layers and the conductive structures.

According to another aspect of the present disclosure, a method of forming a three-dimensional memory device is provided. Conductive structures are formed over a substrate. An alternating stack of insulating layers and spacer material layers is formed over the conductive structures. The spacer material layers are formed as, or are subsequently replaced with, electrically conductive layers. An array of memory structures is formed through the alternating stack. Each of the memory structures includes a vertical stack of memory elements located at levels of the electrically conductive layers. Conductive via structures are formed on the electrically conductive layers. Each conductive via structure is formed directly on a top surface of a respective one of the electrically conductive layers and directly on a top surface of a respective one of the conductive structures, and is electrically insulated from a respective subset of the electrically conductive layers that is located between the respective one of the electrically conductive layers and the conductive structures.

BRIEF DESCRIPTION OF THE DRAWINGS

FIG. 4B is a top-down view of the structure of FIG. 4A.

DETAILED DESCRIPTION

Figure 1A:
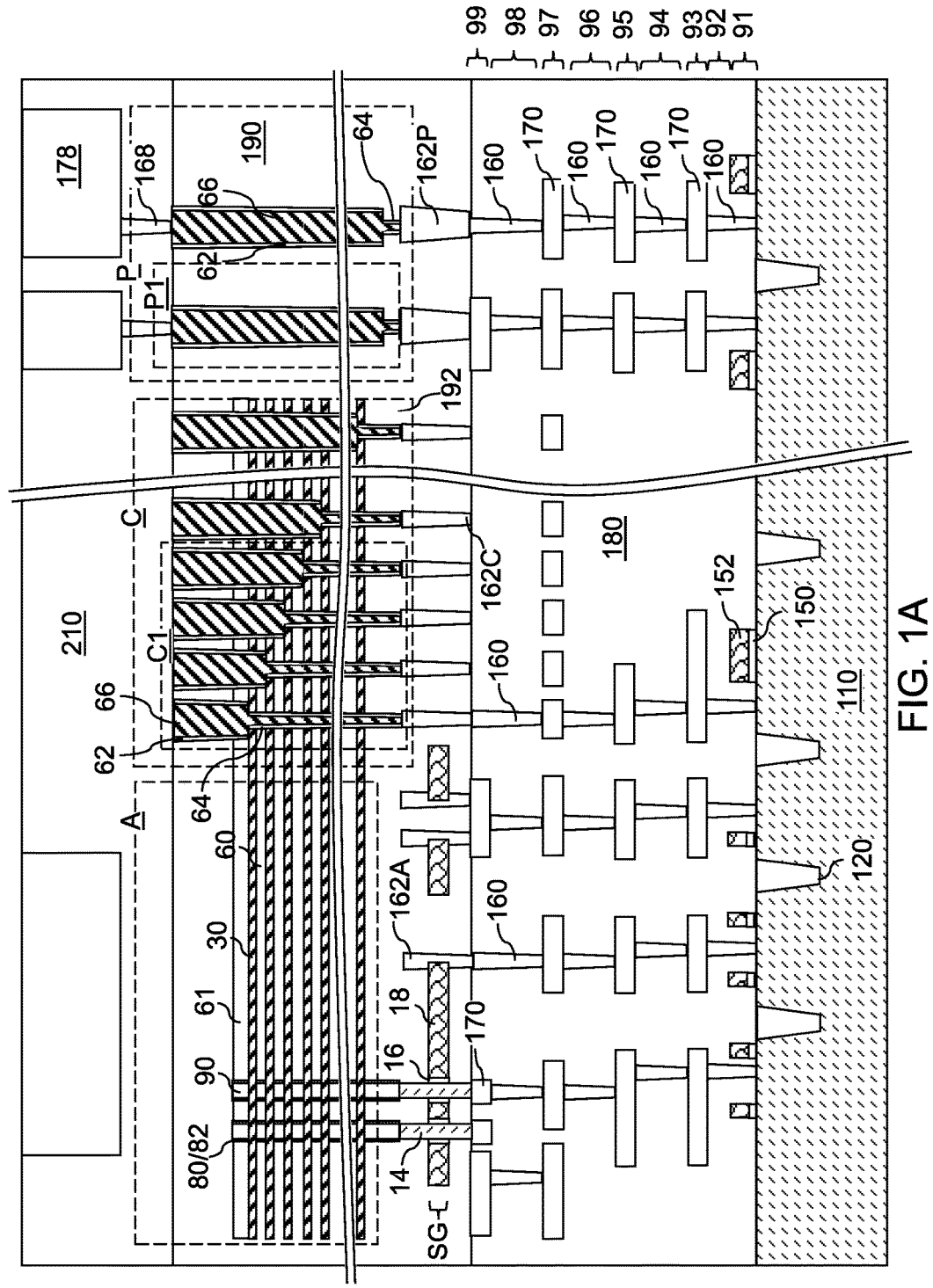
FIG. 1A is a vertical cross-sectional view of a first exemplary structure that includes a three-dimensional memory device according to a first embodiment of the present disclosure.

The various electrically conductive layers embedding the various memory elements of a three-dimensional memory device are typically accessed by various semiconductor devices in a driver circuitry. In many cases, electrical contact to underlying conductive structures (such as metal lines) is provided. While a combination of at least two metal via structures and at least metal line overlying, and contacting, the at least two via structures may be employed to provide such an electrical connection for each of the electrically conductive layers, such an approach can take up a significant area. Thus, a more compact scheme is desired for providing electrical connections between the electrically conductive layers and underlying conductive structures in a three-dimensional memory device.

As discussed above, the present disclosure is directed to a three-dimensional memory devices employing through-stack contact via structures located in a contact region and methods of making the same, the various aspects of which are described below. The embodiments of the disclosure can be employed to form various semiconductor devices such as three-dimensional monolithic memory array devices comprising ReRAM or vertical NAND devices having a more compact through-stack contact via structures.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from $1.0$ S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

The various three dimensional memory devices of the present disclosure can include a ReRAM device, and can be fabricated employing the various embodiments described herein. It is understood that a criss-cross array of memory elements that can be accessed by any access scheme can be employed for the resistive memory devices of the present disclosure, and the exemplary structures of the present disclosure are described herein merely provide non-limiting examples of implementation of the memory devices of the present disclosure.

Referring to FIG. 1A, a first exemplary structure including a three-dimensional memory device is illustrated according to a first embodiment of the present disclosure. The first exemplary structure includes a substrate 110, which can include a semiconductor material layer. In one embodiment, the substrate 110 can be a silicon substrate.

Various semiconductor devices can be formed on the substrate 110. For example, shallow trench isolation structures 120 can be formed in an upper portion of the substrate 110 by forming isolation trenches and filling the isolation trenches with a dielectric material such as silicon oxide. Gate stacks (150, 152) can be formed on the top surface of the substrate 110 by deposition and patterning of a gate dielectric layer and a gate electrode layer. Patterned portions of the gate dielectric layer include gate dielectrics 150. Patterned portions of the gate electrode layer include gate electrodes 152. The level of the gate stacks (150, 152) is herein referred to as a gate level 91. Active regions (not explicitly shown) such as source regions, drain regions, source extension regions, and drain extension regions can be formed by implantation of ions into the upper portion of the substrate 110. Gate spacers including a dielectric material can be formed around the gate stacks (150, 152) by deposition of a conformal dielectric material layer and an anisotropic etch.

Lower interconnect level dielectric material layers 180, lower interconnect level via structures 160, and lower interconnect level line structures 170 can be formed over the various semiconductor devices that are formed on the substrate 110. The levels of the lower interconnect level dielectric material layers 180, the lower interconnect level via structures 160, and the lower interconnect level line structures 170 can include a substrate contact level 92, various metal line levels (such as the levels 93, 95, 97, 99), and various metal via levels (such as levels 94, 96, 98).

Memory level dielectric material layers 190 can be subsequently formed over the lower interconnect level dielectric material layers. Access transistors can be formed at a lower level of the memory level dielectric material layers 190. The access transistors can include access transistor gate electrodes 18, access transistor gate dielectrics 16, and semiconductor portion stacks 14. Each semiconductor portion stack 14 can include a vertical channel region that is laterally surrounded by a respective access transistor gate dielectric 16, and a pair of a source region and a drain region located above and below the channel region. The level of the access transistor gate electrodes 18 is herein referred to as a select gate level or an SG level. Various conductive structures (162A, 162C, 162P) can be formed at a bottom region of the memory level dielectric material layers 190, which can include the level of the select gate level. The conductive structures (162A, 162C, 162P) can include memory level array region conductive structures 162A, memory level contact region conductive structures 162C, and memory level peripheral region conductive structures 162P. When referred to with respect to memory devices to be formed above the level of the conductive structures (162A, 162C, 162P), the conductive structures (162A, 162C, 162P) are referred to as a subset of underlying conductive structures, which include the conductive structures (162A, 162C, 162P), the lower interconnect level via structures 160, and the lower interconnect level line structures 170.

An alternating stack of insulating layers 60 and electrically conductive layers 30 is formed over the access transistors, the memory level array region conductive structures 162A, and the memory level contact region conductive structures 162C. An optional insulating cap layer 61 can be formed over the alternating stack (30, 60). Vertically extending openings can be formed through the optional insulating cap layer 61 and the alternating stack (30, 60) such that a top surface of an underlying semiconductor portion stack 14 is physically exposed at the bottom of each vertically extending opening. A stack of a resistive memory material layer 80 and an optional steering element layer 82 can be formed at the periphery of each vertically extending opening. Subsequently, a vertical bit line 90 can be formed within each remaining volume of the vertically extending cavities and on top surfaces of the semiconductor portion stacks 14.

The alternating stack (30, 60) can be patterned to form a contact region C. A contact region is formed by patterning the alternating stack (30, 60). The region in which all layers of the alternating stack (30, 60) are present includes an array region A. Contact via structures are subsequently formed in the contact region C. The region in which the alternating stack (30, 60) is not present can be employed to provide electrical wiring for peripheral circuitry of the three-dimensional memory device, and as such, is herein referred to as a peripheral region P.

Two-stage contact via cavities are formed in the contact region C and optionally in the peripheral region P. As used herein, a "two-stage" structure refers to a structure having an upper stage having a first width and a lower stage having a second width that is different from the first width. Specifically, each two-stage contact via cavity includes an upper cavity having a respective upper width and a lower cavity having a respective lower width with a top surface of one electrically conductive layer exposed at the bottom of the upper stage.

The two-stage contact via cavities include first type two-stage contact via cavities having a respective upper cavity vertically extending down to a top surface of a respective one of the electrically conductive layers 30 and a respective lower cavity vertically extending from the bottom portion of the upper cavity through each layer of the alternating stack (30, 40) that underlies the upper cavity. Each lower cavity can extend down to a respective one of the memory level contact region conductive structures 162C.

Optionally, the two-stage contact via cavities can include second type two-stage contact via cavities that are formed in the peripheral region P. Each second type two-stage contact via cavity can include a respective upper cavity vertically extending through the entire levels of the alternating stack (30, 60) and a respective lower cavity vertically extending from the bottom portion of the upper cavity to a respective one of the memory level peripheral region conductive structures 162P.

A conformal insulating material layer is formed in the two-stage contact via cavities by a conformal deposition process. Horizontal portions of the conformal insulating material layer can be removed by an anisotropic etch. An upper insulating spacer 62 is formed within each upper cavity of the two-stage contact via cavities, and a lower insulating spacer 64 is formed within each lower cavity of the two-stage contact via cavities. At least one conductive material is deposited in unfilled volumes of the two-stage contact via cavities to form two-stage contact via structures 66.

The two-stage contact via structures 66 can include first type two-stage contact via structures that are formed in the contact region C. Each first type two-stage contact via structure includes an upper portion that extends above the electrically conductive layer 30 and having an upper width and a lower portion that extends through, and below, the electrically conductive layer 30 and having a lower width that is less than the upper width. A bottom horizontal surface of the upper portion contacts a top surface of one of the electrically conductive layers 30.

Upper interconnect level dielectric material layers 210 are formed over the memory level dielectric material layers 190 and the two-stage contact via structures 66. Upper interconnect level via structures 168 and upper interconnect level line structures 178 can be formed within the upper interconnect level dielectric material layers 210.

Figure 1B:
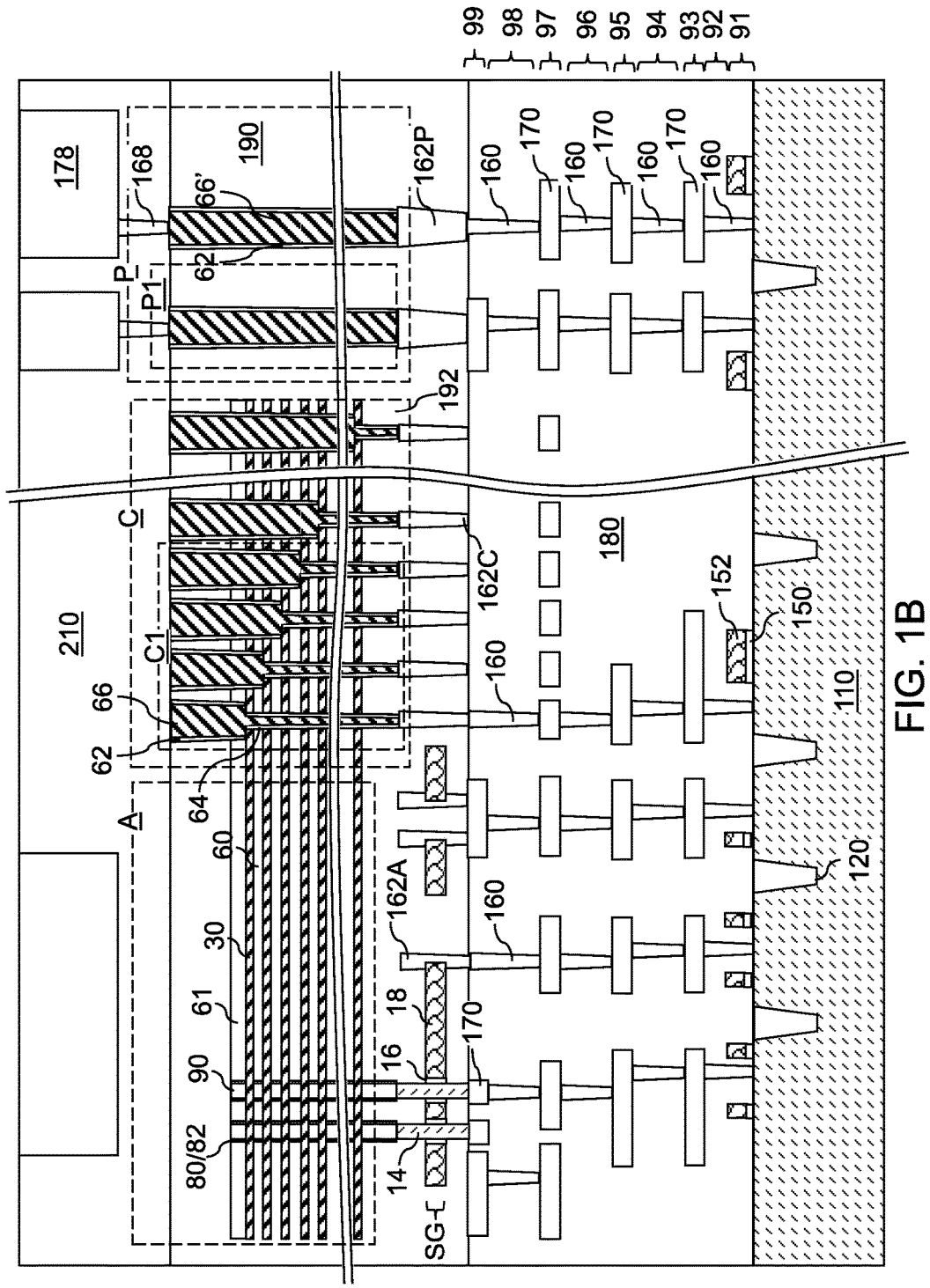
FIG. 1B is a vertical cross-sectional view of an alternative embodiment of the first exemplary structure according to the first embodiment of the present disclosure.

FIG. 1B illustrates an alternative embodiment of the first exemplary structure, in which the second type two-stage contact via structures are replaced with one-stage contact via structures 66' in region P that extend between a topmost surface and a bottommost surface without any horizontal step. The one-stage contact via structures 66' can be derived from the second type two-stage contact via structures 66 of FIG. 1A as the height of the lower portion of each second type two-stage contact via structure shrinks to zero.

FIGS. 2, 4A-4J, 5A, 5B, and 6-12 illustrate a sequence of processing steps for forming the two-stage contact via structures 66 described in FIG. 1A.

Figure 2:
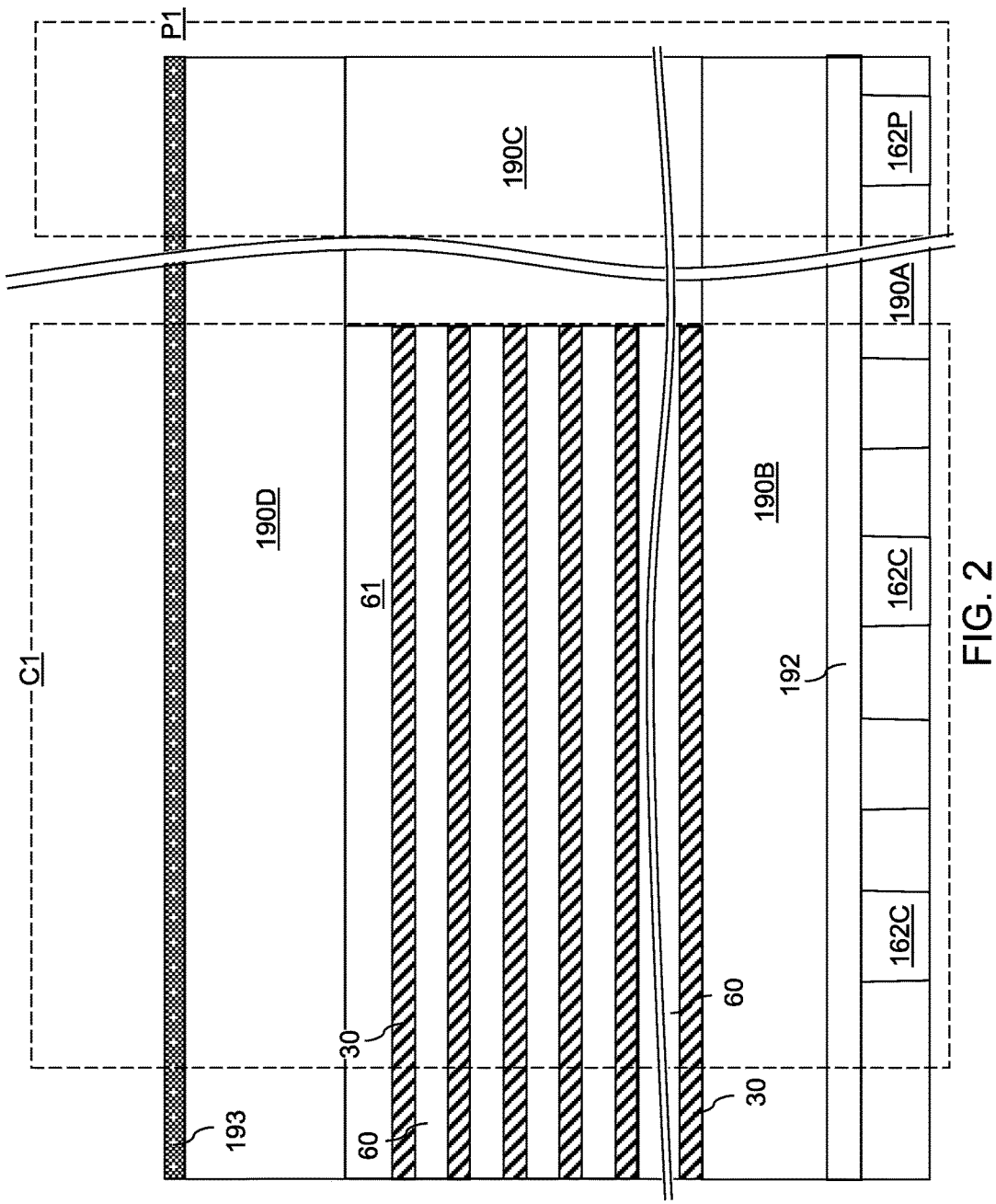
FIG. 2 is a contact region and a peripheral device region of the first exemplary structure after formation of an alternating stack of insulating layers and electrically conductive layers, an insulating cap layer, an optional third memory level dielectric material layer, and a dielectric hard mask layer according to the first embodiment of the present disclosure.

Referring to FIG. 2, a portion of the first exemplary structure is shown at a processing step during fabrication. Processing steps up to formation of the memory level dielectric material layers 190 can be performed. The memory level dielectric material layers 190 can include a first memory level dielectric material layer 190A embedding the memory level contact region conductive structures 162C and memory level peripheral region conductive structures 162P. The memory level contact region conductive structures 162C can be located within an illustrated contact region C1, which is an illustrated portion of the contact region C in FIG. 1A. The memory level peripheral region conductive structures 162P can be located within an illustrated peripheral region P1, which is an illustrated portion of the peripheral region P in FIG. 1A. The memory level array region conductive structures 162A (shown in FIGS. 1A and 1B) can be located within the array region A. The memory level contact region conductive structures 162C can include metal interconnect lines that provide control signals to the electrically conductive layers 30 within the alternating stack of insulating layers 60 and the electrically conductive layers 30.

The memory level dielectric material layers 190 can include an optional etch stop dielectric layer 192 that is formed on the top surface of the memory level conductive structures (162C, 162P). The optional etch stop dielectric layer 192 includes a dielectric material having a greater etch resistivity than another dielectric material that is deposited over the etch stop dielectric layer 192 to form a second memory level dielectric material layer 190B. For example, the first and second memory level dielectric material layers (190A, 190B) can include silicon oxide, and the etch stop dielectric layer 192 can include silicon nitride or a dielectric metal oxide (such as aluminum oxide). Various semiconductor devices such as access transistors can be formed at the level of the first and second memory level dielectric material layers (190A, 190B) and the optional etch stop dielectric layer 192 within the array region A. Exemplary semiconductor devices that can be formed in the array region A are described in a subsequent section.

An alternating stack of insulating layers 60 and spacer material layers are formed over the second memory level dielectric material layer 190B. The spacer material layers can be formed as electrically conductive layers 30, or can be formed as sacrificial material layers and can be subsequently replaced with electrically conductive layers 30. While the present disclosure is described employing an embodiment in which the spacer material layers are formed as electrically conductive layers 30, embodiments are expressly contemplated herein in which the spacer material layers are formed as sacrificial material layers, and are subsequently replaced with electrically conducive layers 30 after formation of memory elements within the array region A. In case the spacer material layers are formed as electrically conductive layers 30, an alternating stack of insulating layers 60 and electrically conductive layers 30 can be formed on the second memory level dielectric material layer 190B. An insulating cap layer 61 can be formed over the alternating stack (30, 60).

An array of memory structures can be formed through the alternating stack (30, 60). Each of the memory structures includes memory elements (e.g., portions of resistive memory material layer or a charge trapping layer) located at levels of the electrically conductive layers 30. Three-dimensional memory elements can be formed in the array region A, which may include resistive random access memory (ReRAM) cells. Exemplary ReRAM devices that can be formed in the array region A are described in a subsequent section.

Portions of the insulating cap layer 61 and the alternating stack (30, 60) can be removed from the peripheral region P, for example, by a combination of lithographic patterning and an anisotropic etch. A memory level dielectric material portion 190C can then be formed in the peripheral region in place of the removed portions of the insulating cap layer 61 and the alternating stack (30, 60).

An optional third memory level dielectric material layer 190D can be formed over the alternating stack (30, 60) and the memory level dielectric material portion 190C as another component of the memory level dielectric material layers 190. The optional third memory level dielectric material layer 190D can include, for example, silicon oxide. The thickness of the third memory level dielectric material layer 190D, if present, can be in a range from 50 nm to 1,000 nm, although lesser and greater thicknesses can also be employed.

A dielectric hard mask layer 193 can be formed over the optional third memory level dielectric material layer 190D and/or the alternating stack (30, 60) and the memory level dielectric material portion 190C as another component of the memory level dielectric material layers 190. The dielectric hard mask layer 193 can be employed as an etch stop layer during subsequent anisotropic etch processes, and may also be employed as a stopping layer in a subsequent planarization process such as chemical mechanical planarization (CMP). The dielectric hard mask layer 193 can include, if present, silicon nitride and/or a dielectric metal oxide (such as aluminum oxide).

Figure 3:
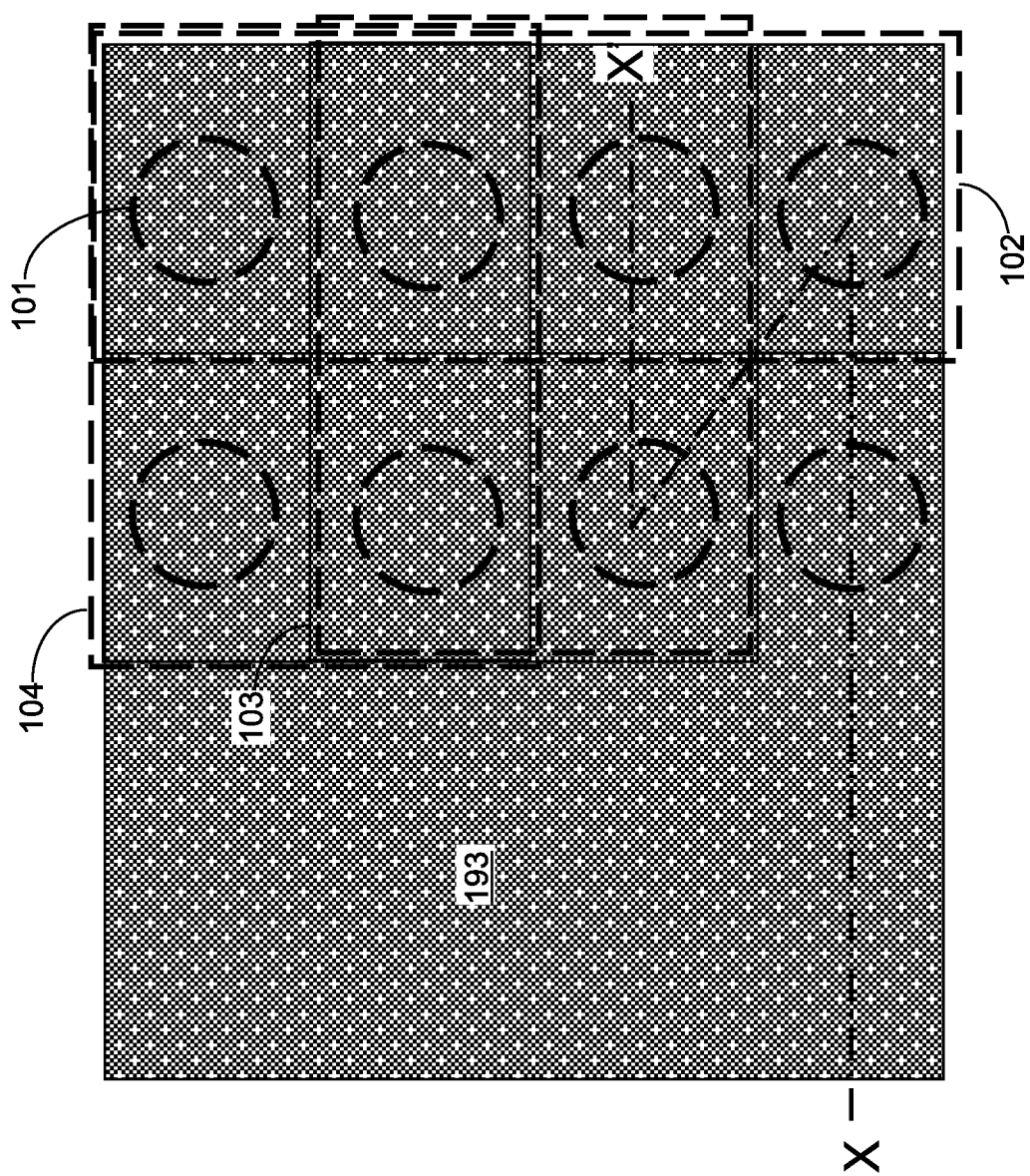
FIG. 3 is a top-down view of the contact region of the first exemplary structure of FIG. 2. Openings in various lithographic masks are illustrated in dotted lines. The zig-zag vertical plane X-X' is the plane of the vertical cross-sectional view of FIG. 2.

Upper contact via cavities can be formed by employing a set of patterned etch masks (such as patterned photoresist layers) that provide different opening areas. FIG. 3 illustrates an example in which 4 different patterned etch masks that provide 4 different opening areas, which include upper contact via cavity areas 101, a first opening area 102, a second opening area 103, and a third opening area 104. A first photoresist layer including the pattern of the upper contact via cavity areas 101 can be employed to define the areas all upper contact via cavities irrespective of their final depth. Via-blocking photoresist layers can be subsequently employed to block, i.e., cover, a respective subset of upper contact via cavities to prevent further etching of the respective subset of upper contact via cavities in a respective subsequent etch process.

By designing the shapes of the opening areas (102, 103, 104) for the via-blocking photoresist layers to have intersecting areas, 8 different depths can be provided for the upper contact via cavities in case three different opening areas (102, 103, 104) are employed. For each integer i among 1, 2, and 3, $2^{i-1}$ levels of electrically conductive layers 30 can be etched within the i-th opening area. For example, a single insulating layer 60 and a single electrically conductive layer 30 can be etched within the first opening area 102, two insulating layers 60 and two electrically conductive layers 30 can be etched within the second opening area 103, and four insulating layers 60 and four electrically conductive layers 30 can be etched within the third opening area 104. The combination of three patterned etch masks having overlapping areas can thus generate $2^3=8$ horizontal surfaces of the electrically conductive layers 30 that are not covered by any overlying electrically conductive layer 30.

Generally speaking, N masks having overlapping opening areas can generate $2^N$ different overlapping areas to provide $2^N$ electrically conductive layers 30 having a respective horizontal surface that is not covered by any overlying electrically conductive layer 30, thereby providing a contact region in which horizontal top surfaces of each of the $2^N$ electrically conductive layers 30 are physically exposed in a top-down plan view. The number N can be in a range from 2 to 10, although a greater number can also be employed. In the contact region, each electrically conductive layer 30 that is not a bottommost electrically conductive layer 30 has a lesser area than any underlying electrically conductive layer 30 among the electrically conductive layers 30.

Figure 4A:
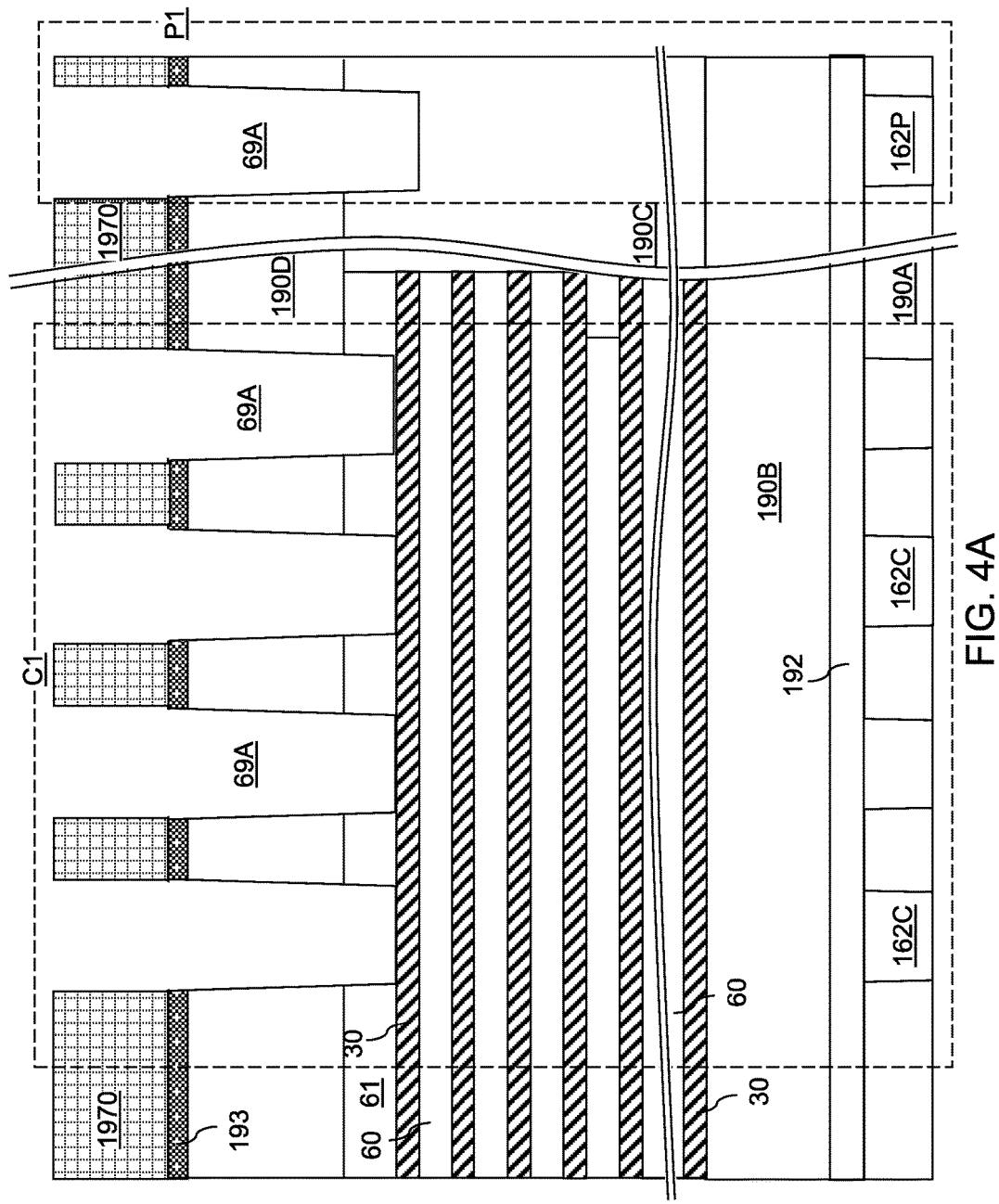
FIG. 4A is a vertical cross-sectional view of the contact region and the peripheral device region of the first exemplary structure after formation of upper contact via cavities through the levels of the dielectric hard mask layer, the optional third memory level dielectric material layer, and the insulating cap layer along a vertical plane corresponding to the zig-zag vertical plane X-X' of FIG. 3 according to the first embodiment of the present disclosure.

Referring to FIGS. 4A and 4B, a photoresist layer, which is herein referred to as a via-cavity-defining photoresist layer 1970, is applied over the dielectric hard mask layer 193, and is lithographically patterned to form openings in the upper contact via cavity areas 101 shown in FIG. 3. The upper contact via cavity areas 101 include each area in which upper contact via cavities 69A are to be subsequently formed, and includes areas within the contact region C (which includes the illustrated contact region C1) and can also include area(s) within the peripheral region P (which includes the illustrated peripheral region P1).

An anisotropic etch is performed to transfer the pattern of the openings in the via-cavity-defining photoresist layer 1970 through the levels of the dielectric hard mask layer 193, the optional third memory level dielectric material layer 190D, and the insulating cap layer 61. The chemistry of the anisotropic etch is selected such that the anisotropic etch process is selective to the material of the electrically conductive layers 30 (or sacrificial material layers in case the spacer material layers are provided as the sacrificial material layers and replacement of the sacrificial material layers with electrically conducive layers 30 has not been performed yet). In other words, the insulating layers 60 are preferentially etched compared to the electrically conductive layers 30.

Upper contact via cavities 69A are formed underneath each opening in the via-cavity-defining photoresist layer 1970. Top surfaces of the topmost electrically conductive layers 30 are physically exposed at a bottom of each of the upper contact via cavities 69A within the contact region C that includes the illustrated contact region C1. In other words, each bottom surface of the upper contact via cavities 69A in the contact region C can be a physically exposed top surface of the topmost electrically conductive layer 30. Within the peripheral region P that includes the illustrated peripheral region P1, each bottom surface of the upper contact via cavities 69A can be a horizontal surface of the memory level dielectric material portion 190C. The via-cavity-defining photoresist layer 1970 is subsequently removed, for example, by ashing.

Figure 4C:
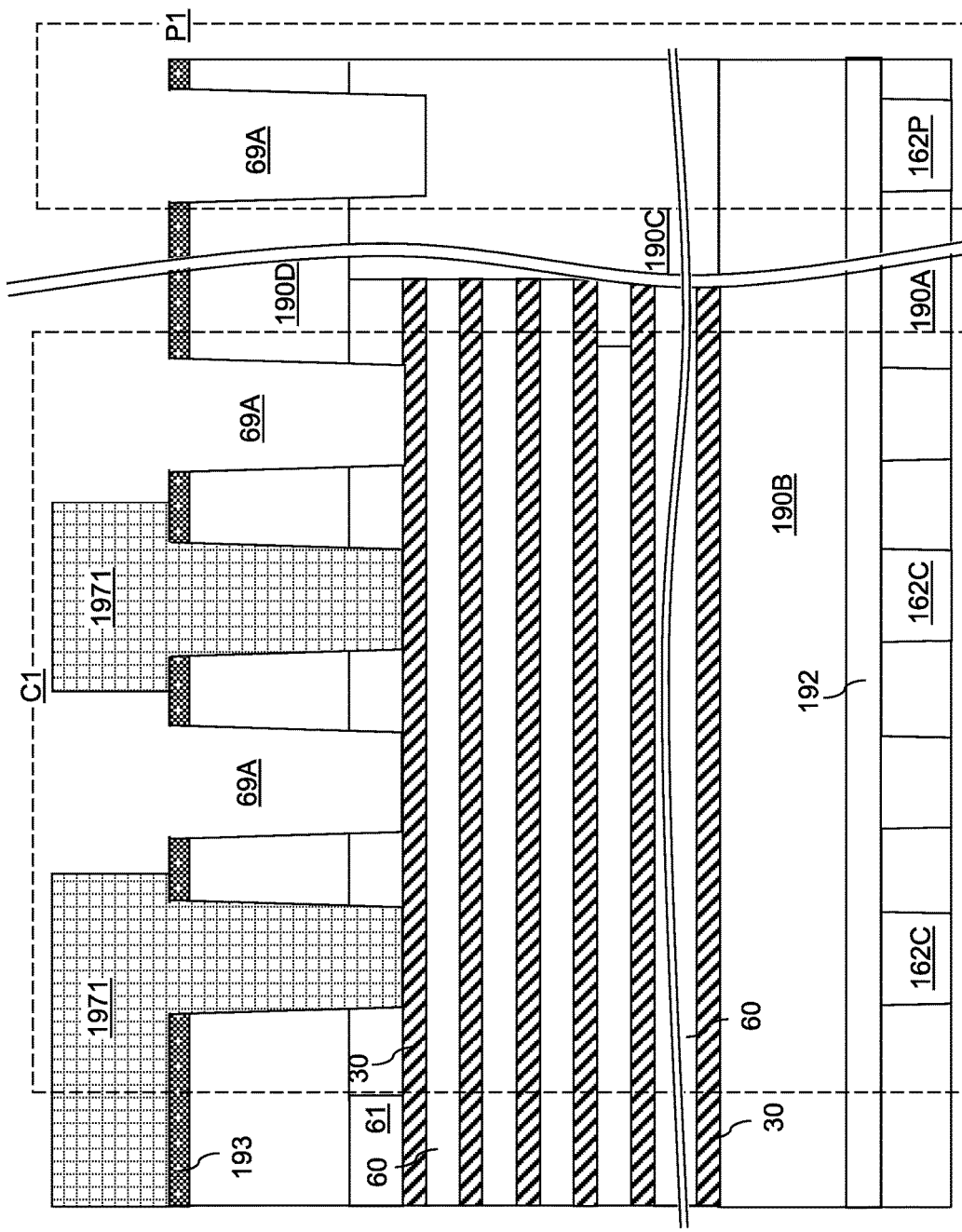
FIG. 4C is a vertical cross-sectional view of the contact region and the peripheral device region of the first exemplary structure after application and patterning of a first via-blocking photoresist layer along a vertical plane corresponding to the zig-zag vertical plane X-X' of FIG. 3 according to the first embodiment of the present disclosure.
Figure 4D:
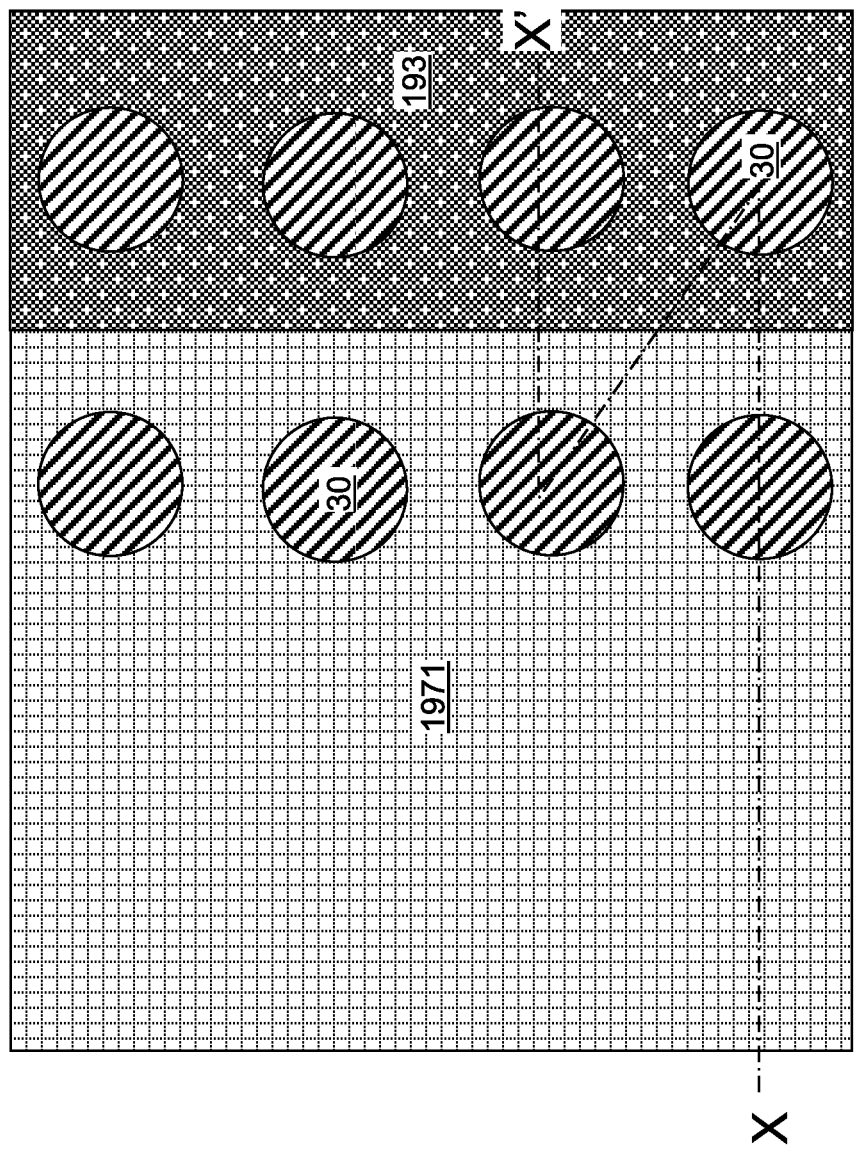
FIG. 4D is a top-down view of the structure of FIG. 4C.

Referring to FIGS. 4C and 4D, a photoresist layer, which is herein referred to as a first via-blocking photoresist layer 1971, is applied over the dielectric hard mask layer 193, and is lithographically patterned to form openings in the first opening area 102 shown in FIG. 3. The first opening area 102 includes each area in which upper contact via cavities 69A, upon completion of formation, are to vertically extend to even numbered electrically conductive layers 30 as counted from the top. In other words, when the topmost electrically conductive layer 30 is labeled as a first electrically conductive layer, the second electrically conductive layer 30 from the top is labeled as a second electrically conductive layer, and each electrically conductive layer 30 that occupies the i-th position as counted from the top is labeled as an i-th electrically conductive layer, the first opening area 102 includes each area in which upper contact via cavities 69A, upon completion of formation, are to vertically extend to even numbered electrically conductive layers 30. The first opening area 102 includes an area inside the contact region C (which includes the illustrated contact region C1) and optionally another area within the peripheral region P (which includes the illustrated peripheral region P1).

Figure 4E:
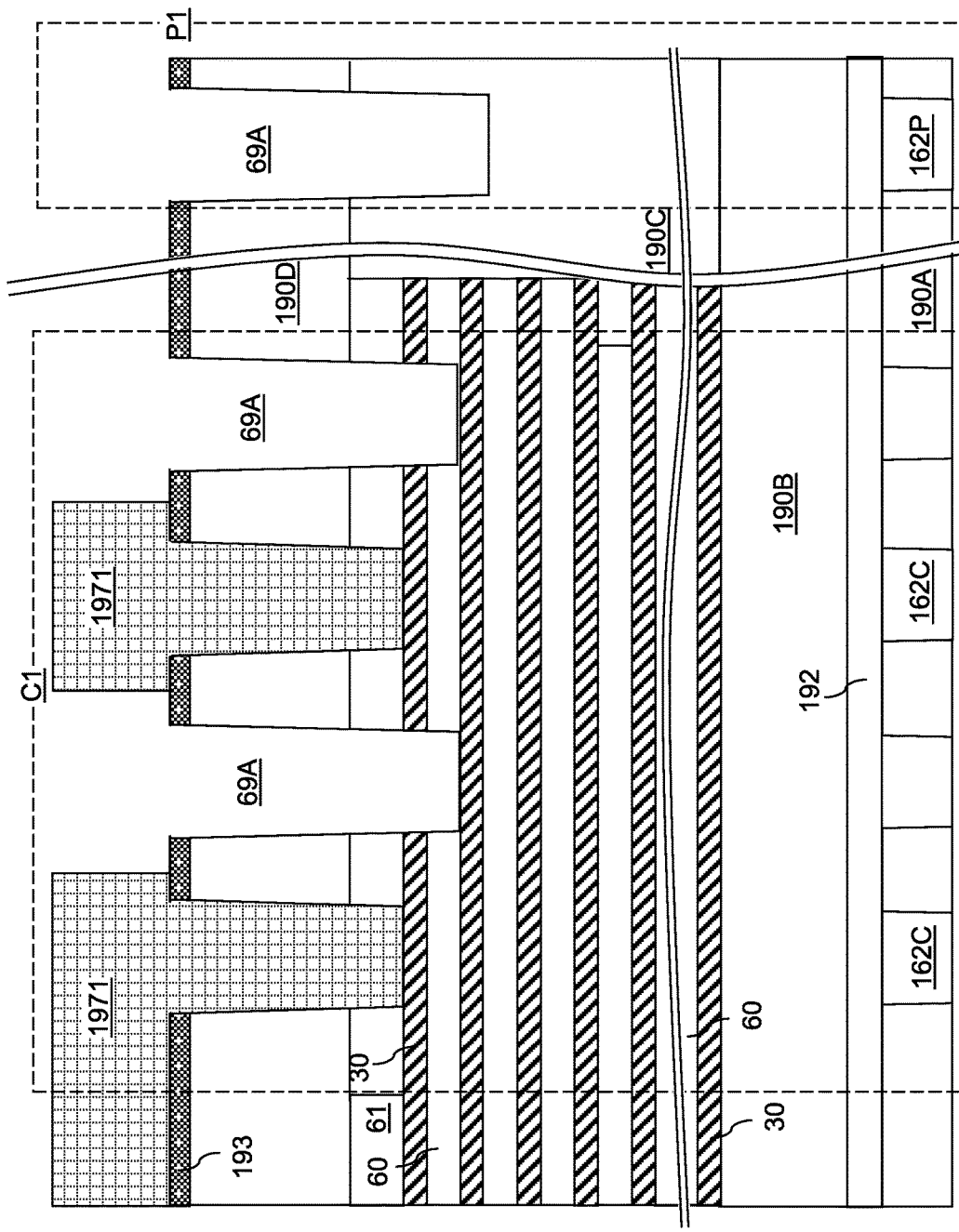
FIG. 4E is a vertical cross-sectional view of the contact region and the peripheral device region of the first exemplary structure after vertical extension of each unmasked upper contact via cavity by one pair of an electrically conductive layer and an insulating layer along a vertical plane corresponding to the zig-zag vertical plane X-X' of FIG. 3 according to the first embodiment of the present disclosure.
Figure 4F:
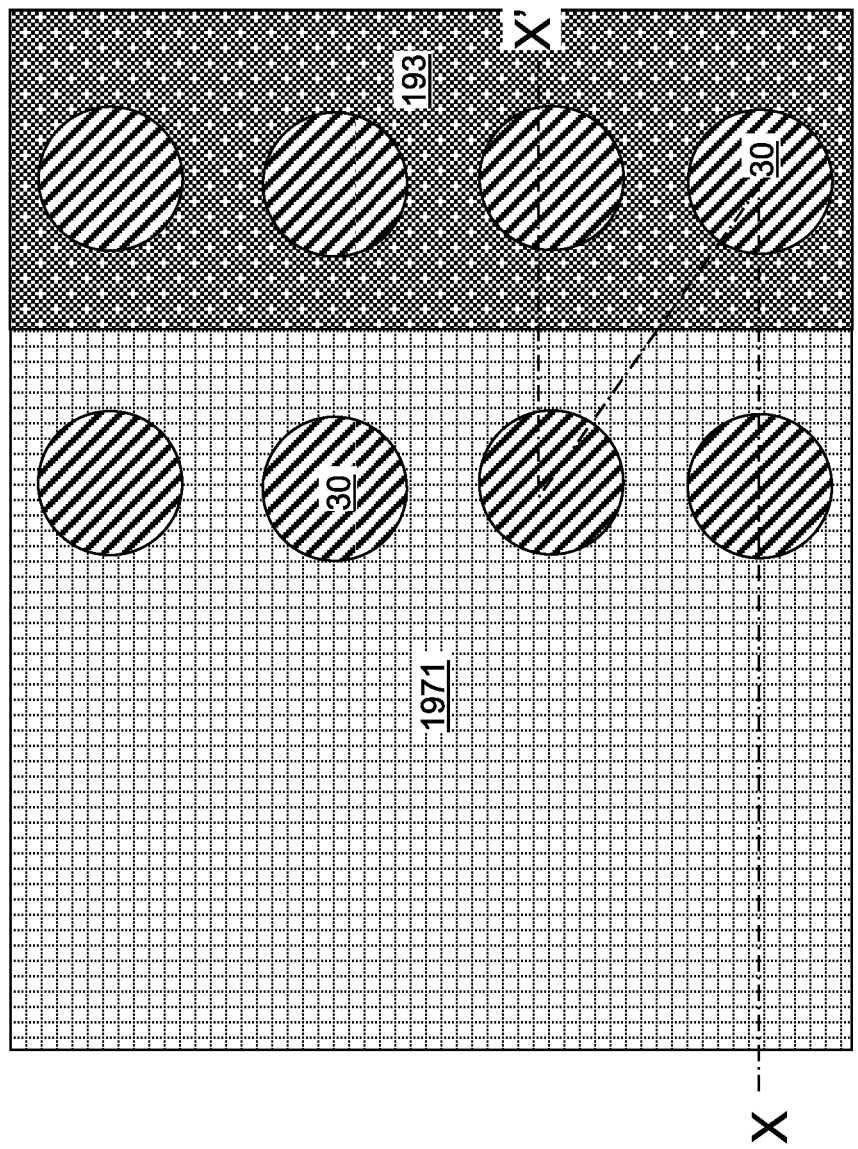
FIG. 4F is a top-down view of the structure of FIG. 4E.

Referring to FIGS. 4E and 4F, an anisotropic etch is performed to transfer the pattern of the openings in the first via-blocking photoresist layer 1971 through the levels of one pair of an electrically conductive layer 30 and an insulating layer 60. In this case, the pattern of the openings in the first via-blocking photoresist layer 1971 can be transferred through the topmost electrically conductive layer 30 and the topmost insulating layer 60. The chemistry of the anisotropic etch is selected such that the anisotropic etch process is selective to the material of the electrically conductive layers 30 at the end of the last step that etches the topmost insulating layer 60.

The upper contact via cavities 69A are vertically extended only within the unmasked area, i.e., only within the first opening area 102 within the first via-blocking photoresist layer 1971. After the anisotropic etch, top surfaces of a lower level (e.g., second from the top level) electrically conductive layer 30 are physically exposed at a bottom of each vertically extended upper contact via cavity 69A within the contact region C that includes the illustrated contact region C1. Within the peripheral region P that includes the illustrated peripheral region P1, each bottom surface of the vertically extended upper contact via cavities 69A can be a horizontal surface of the memory level dielectric material portion 190C. In one embodiment, each upper contact via cavity 69A can be vertically extended in the peripheral region P. The first via-blocking photoresist layer 1971 is subsequently removed, for example, by ashing.

Figure 4G:
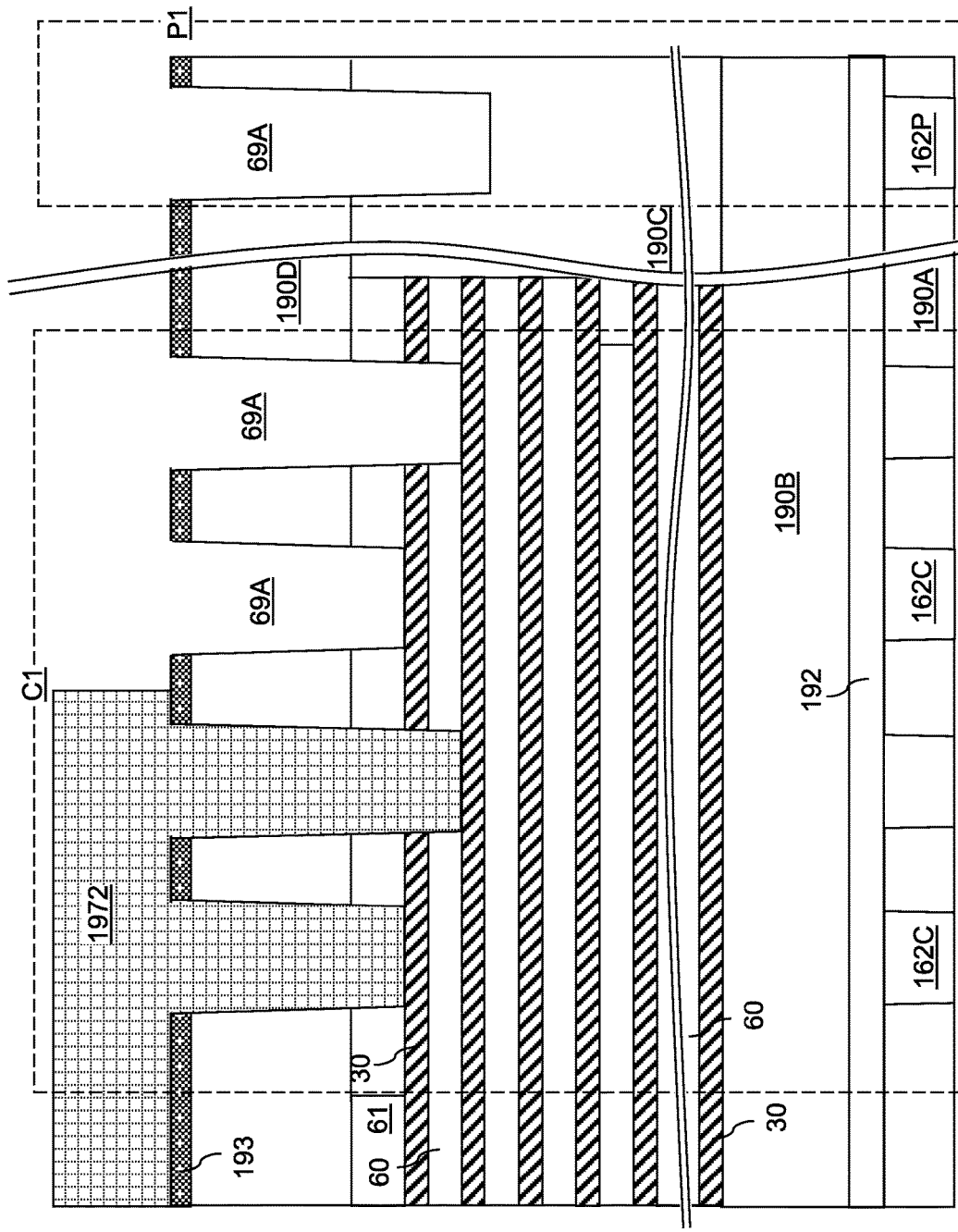
FIG. 4G is a vertical cross-sectional view of the contact region and the peripheral device region of the first exemplary structure after application and patterning of a second via-blocking photoresist layer along a vertical plane corresponding to the zig-zag vertical plane X-X' of FIG. 3 according to the first embodiment of the present disclosure.
Figure 4H:
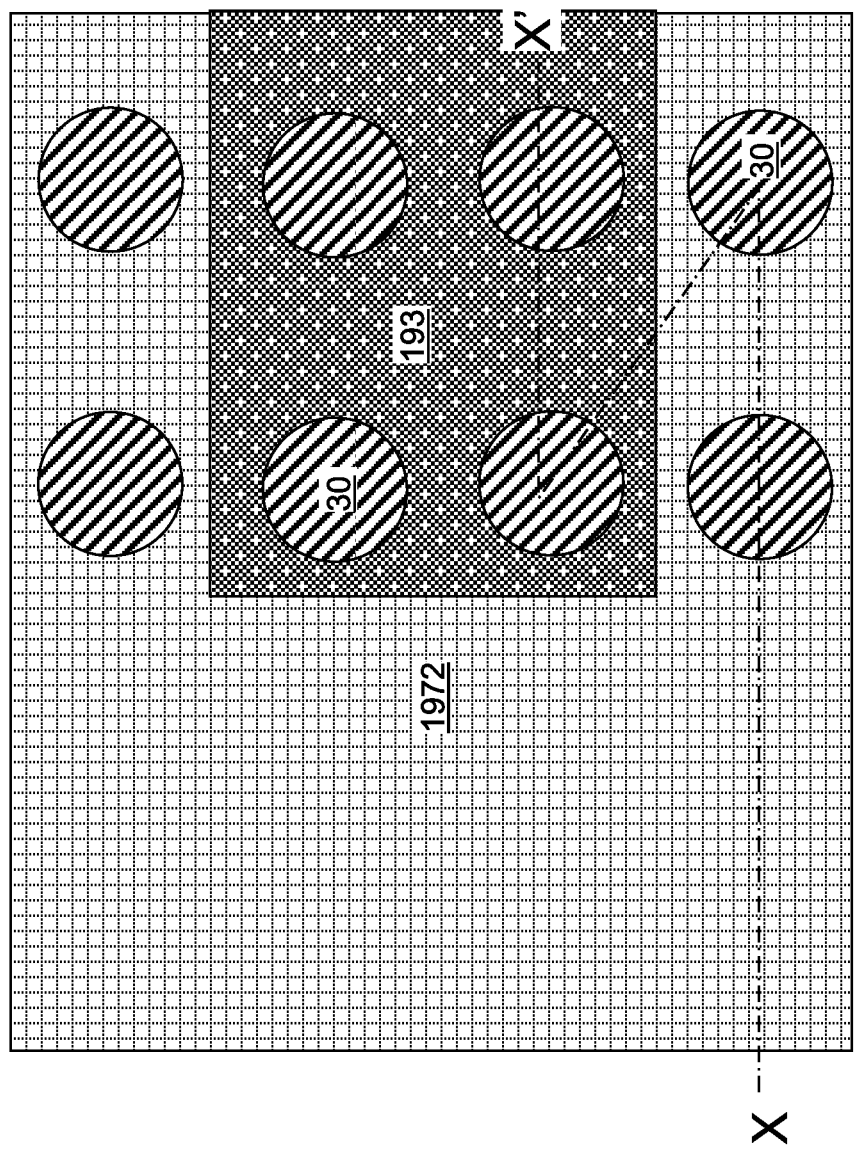
FIG. 4H is a top-down view of the structure of FIG. 4G.

Referring to FIGS. 4G and 4H, a photoresist layer, which is herein referred to as a second via-blocking photoresist layer 1972, is applied over the dielectric hard mask layer 193, and is lithographically patterned to form openings in the second opening area 103 shown in FIG. 3. The second opening area 103 includes each area in which upper contact via cavities 69A, upon completion of formation, are to vertically extend to third and fourth electrically conductive layers 30. The second opening area 103 includes an area inside the contact region C (which includes the illustrated contact region C1) and another area within the peripheral region P (which includes the illustrated peripheral region P1).

Figure 4I:
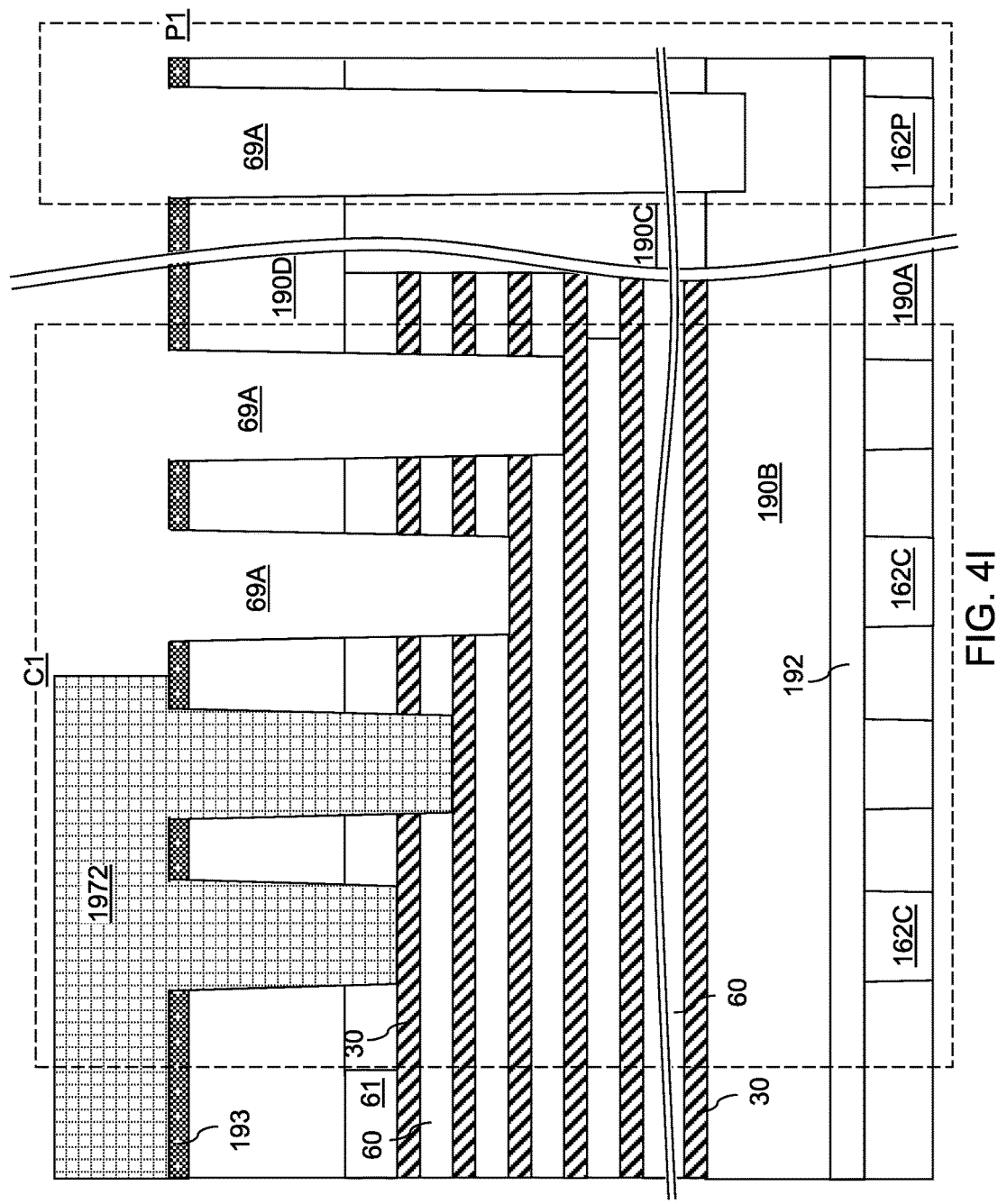
FIG. 4I is a vertical cross-sectional view of the contact region and the peripheral device region of the first exemplary structure after vertical extension of each unmasked upper contact via cavity by two pairs of an electrically conductive layer and an insulating layer along a vertical plane corresponding to the zig-zag vertical plane X-X' of FIG. 3 according to the first embodiment of the present disclosure.
Figure 4J:
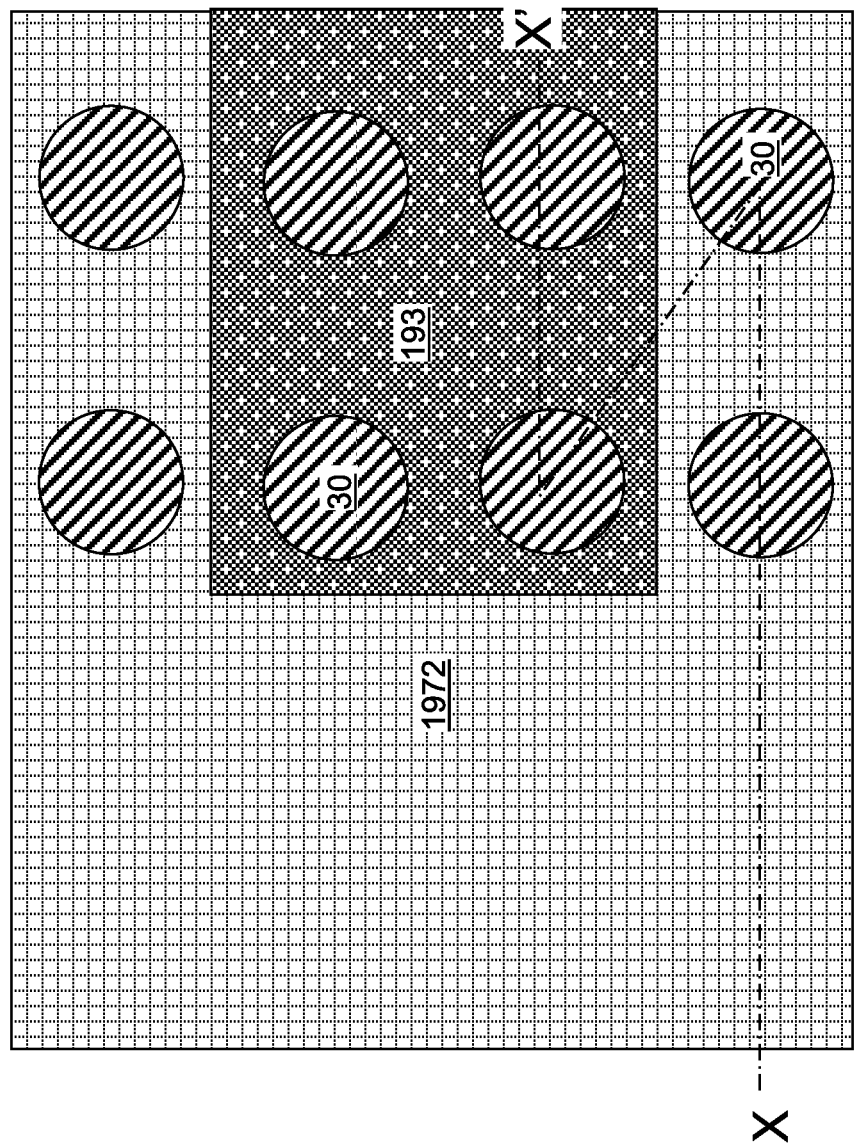
FIG. 4J is a top-down view of the structure of FIG. 4I.

Referring to FIGS. 4I and 4J, an anisotropic etch is performed to transfer the pattern of the openings in the second via-blocking photoresist layer 1972 through the levels of two pairs of an electrically conductive layer 30 and an insulating layer 60. The chemistry of the anisotropic etch is selected such that the anisotropic etch process is selective to the material of the electrically conductive layers 30 at the end of the last step that etches an insulating layer 60.

The upper contact via cavities 69A are vertically extended only within the unmasked area, i.e., only within the second opening area 103 within the second via-blocking photoresist layer 1972. After the anisotropic etch, top surfaces of lower level (e.g., third and fourth from the top levels) electrically conductive layers 30 are physically exposed at a bottom of each vertically extended upper contact via cavity 69A within the contact region C that includes the illustrated contact region C1. Within the peripheral region P that includes the illustrated peripheral region P1, each bottom surface of the vertically extended upper contact via cavities 69A can be a horizontal surface of the memory level dielectric material portion 190C. In one embodiment, each upper contact via cavity 69A can be vertically extended in the peripheral region P. The second via-blocking photoresist layer 1972 is subsequently removed, for example, by ashing.

Application and patterning of i-th via-blocking photoresist layer to form openings in the i-th opening area, and an anisotropic etch that removes $2^{(i-1)}$ pairs of an electrically conductive layer 30 and an insulating layer 60 can be performed for each integer i that is greater than 2 up to the maximum number of the via blocking mask levels. Generally, N number of via blocking masks can provide upper contact via cavities 69A extending to top surfaces of $2^N$ different electrically conductive layers 30. The depth of the upper contact via cavities 69A in the peripheral regions P can be adjusted to any target depth by covering one or more of the upper contact via cavities 69A in the peripheral regions P with one or more of the via-blocking photoresist layers during any one or more of the vertical extensions of the upper contact via cavities 69A in the contact region C. Each via-blocking photoresist layer can be subsequently removed, for example, by ashing.

Figure 5A:
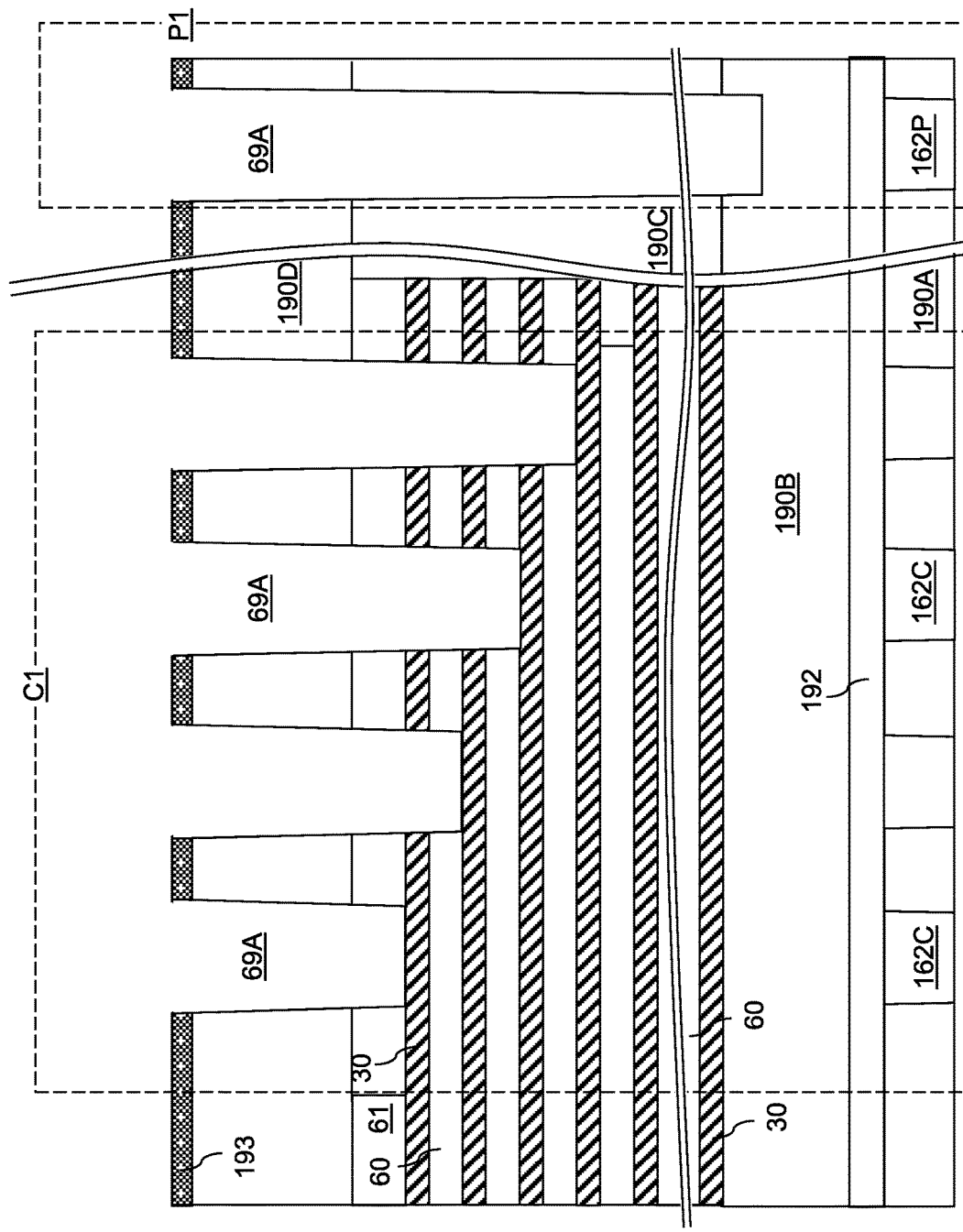
FIG. 5A is a vertical cross-sectional view of the contact region and the peripheral device region of the first exemplary structure after completion of vertical extension of the contact via cavities according to the first embodiment of the present disclosure.
Figure 5B:
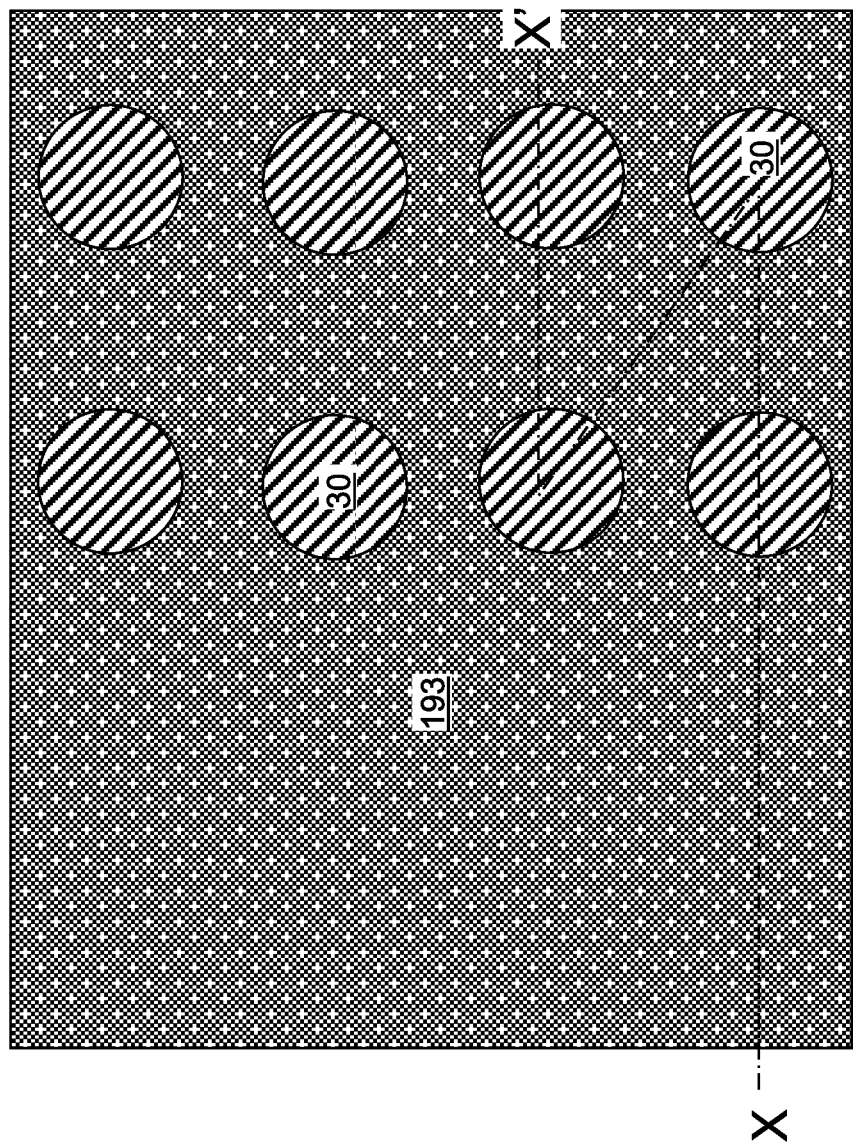
FIG. 5B is a top-down view of the contact region of the first exemplary structure of FIG. 5A. The zig-zag vertical plane X-X' is the plane of the vertical cross-sectional view of FIG. 5A.

FIGS. 5A and 5B illustrate portions of the contact region C and the peripheral region P after completion of vertical extension of upper contact via cavities 69A. After the last anisotropic etch process that provides the deepest upper contact via cavity 69A in the contact region C, each bottom surface of the upper contact via cavities 69A in the peripheral region P can be a horizontal surface of the second memory level dielectric layer 190B, the etch stop dielectric layer 192, or a respective one of the memory level peripheral region conductive structures 162P. Each of the upper contact via cavities 69A can have vertical sidewalls or tapered sidewalls. The width of the upper contact via cavities 69A, as measured at the bottom of the respective upper contact via cavity 69A between points with a maximum lateral separation distance, can be in a range from 50 nm to 500 nm, although lesser and greater thicknesses can also be employed.

Figure 6:
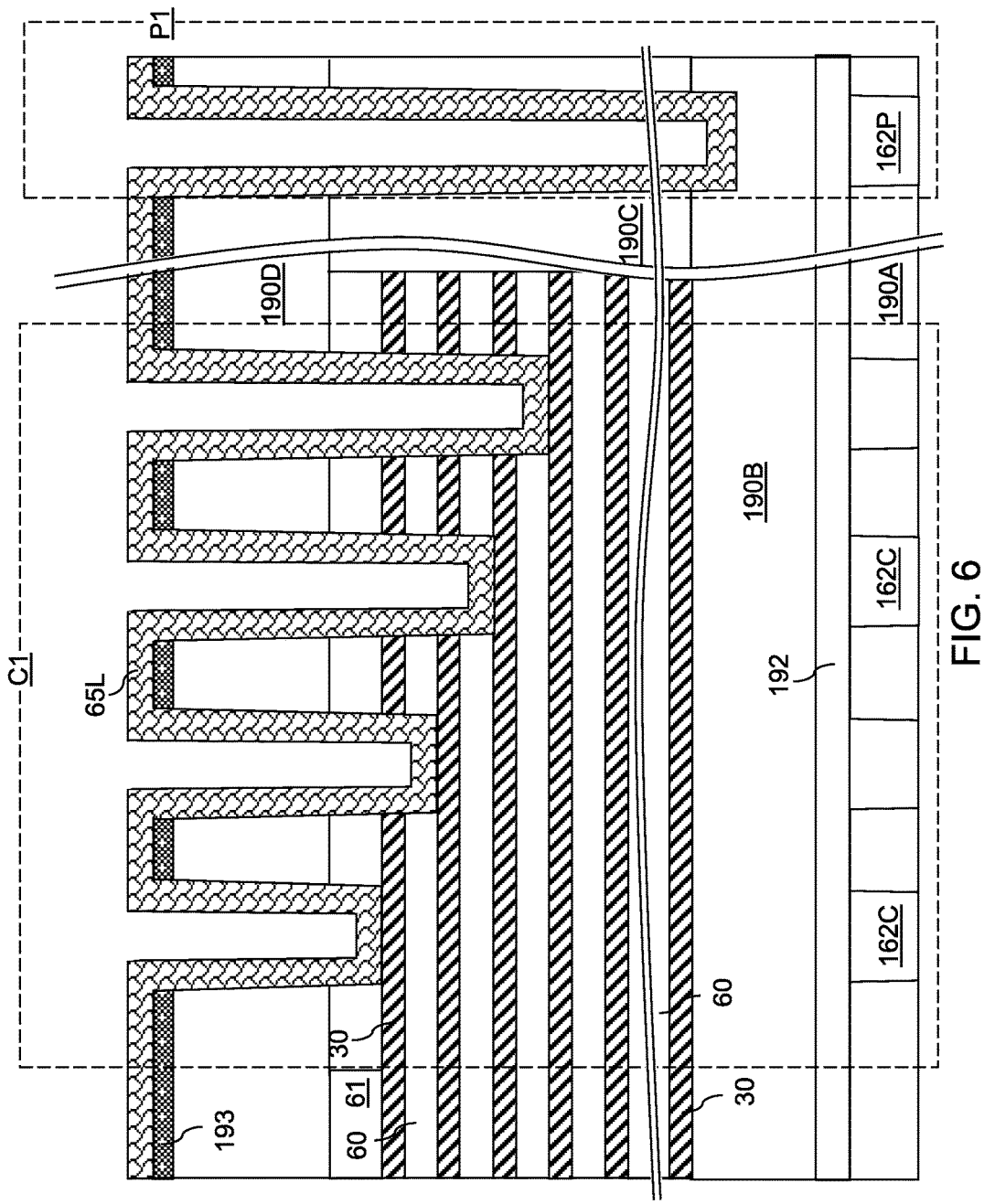
FIG. 6 is a vertical cross-sectional view of the contact region and the peripheral device region after formation of a sacrificial spacer material layer according to the first embodiment of the present disclosure.

Referring to FIG. 6, a sacrificial spacer material layer 65L can be deposited within the upper contact via cavities 69A and over the memory level dielectric material layers (190A, 192, 190B, 190C, 190D, 193). The sacrificial spacer material layer 65L includes a material that can be removed selective to the materials of the dielectric hard mask layer 193, the optional third memory level dielectric material layer 190D, the memory level dielectric material portion 190C, and the electrically conductive layers 30. For example, the sacrificial spacer material layer 65L can include an insulating material, such as silicon nitride or amorphous carbon (e.g., advanced patterning film ("APF™") from Applied Materials, Inc.) or a semiconductor material such as amorphous silicon, polysilicon, or a silicon-germanium alloy. The sacrificial spacer material layer 65L can be deposited by a conformal deposition method such as chemical vapor deposition. The thickness of the sacrificial spacer material layer 65L can be less than one half of the minimum width of the upper contact via cavities 69A.

Figure 7:
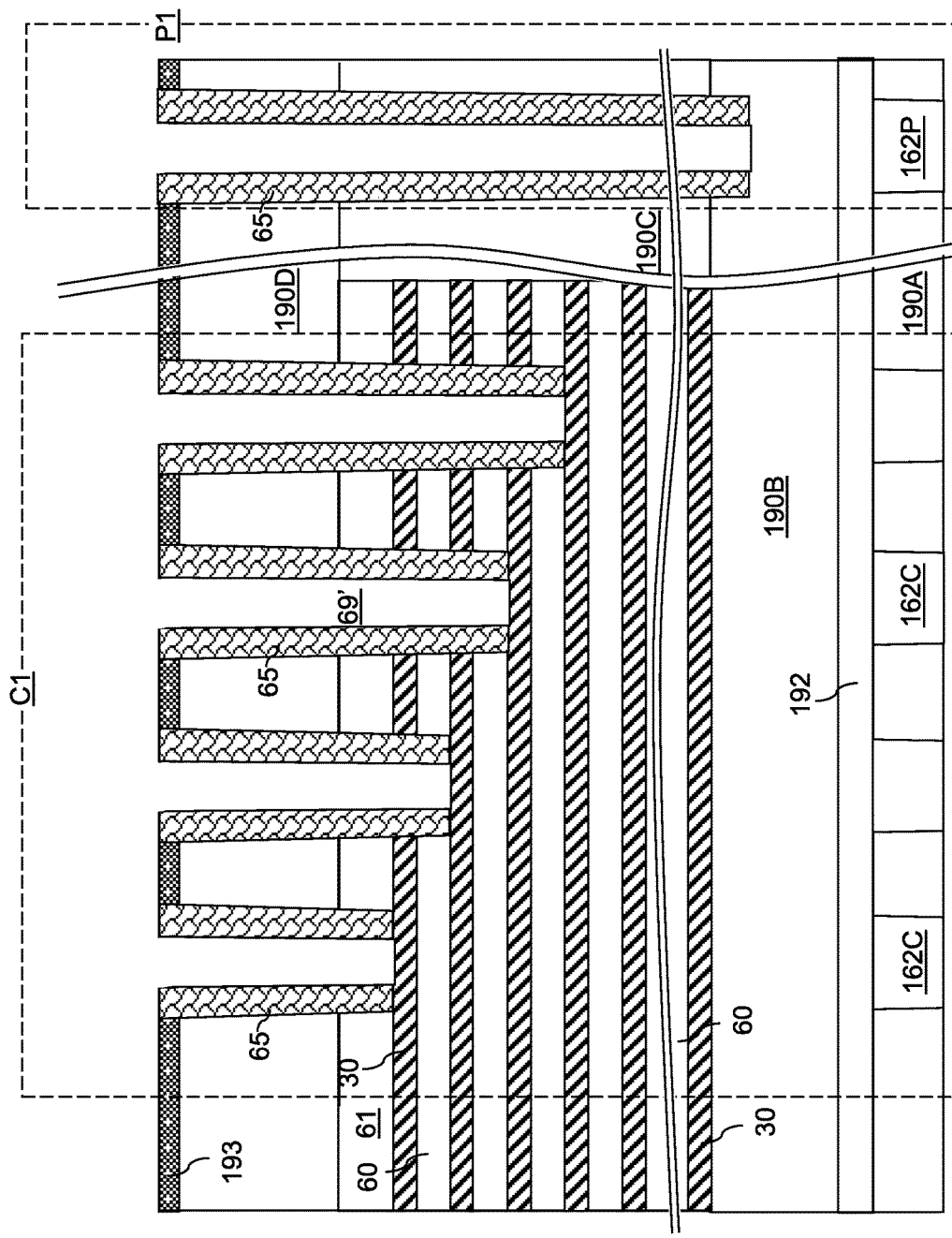
FIG. 7 is a vertical cross-sectional view of the contact region and the peripheral device region after formation of sacrificial spacers in the contact via cavities according to the first embodiment of the present disclosure.

Referring to FIG. 7, the sacrificial spacer material layer 65L can be anisotropically etched to remove horizontal portions from above the memory level dielectric material layers (190A, 192, 190B, 190C, 190D, 193) and from the bottom regions of the upper contact via cavities 69A. Each remaining tubular portion of the sacrificial spacer material layer 65L forms a sacrificial spacer 65. Each sacrificial spacer 65 is a sidewall spacer formed at a periphery of a respective upper contact via cavity 69A. A cavity 69' which exposes a top surface of one of the electrically conductive layers 30 is present within each sacrificial spacer 65.

Figure 8:
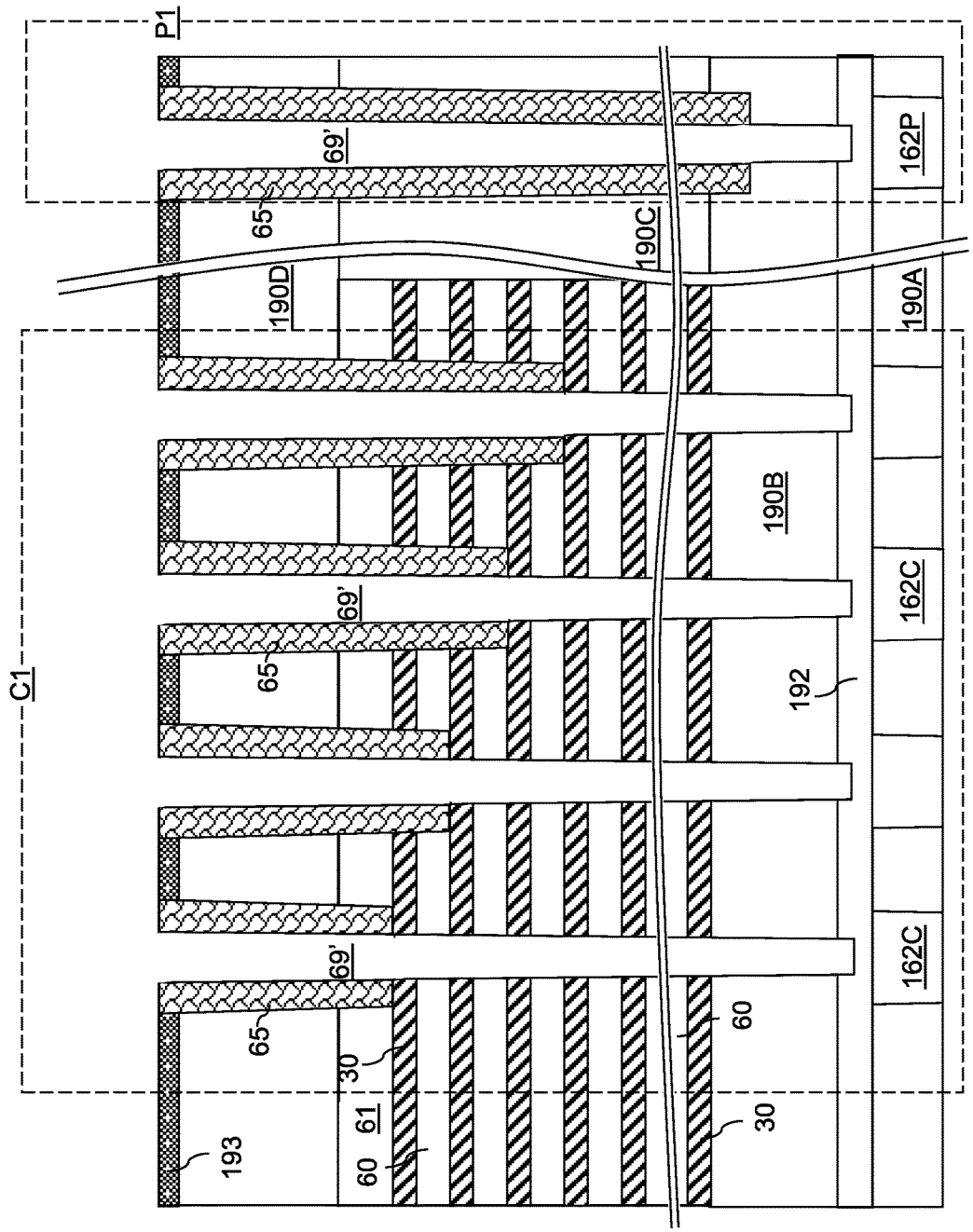
FIG. 8 is a vertical cross-sectional view of the contact region and the peripheral device region after extension of the contact via cavities to an etch stop dielectric layer according to the first embodiment of the present disclosure.

Referring to FIG. 8, a second anisotropic etch process is performed to vertically extend the cavities 69' through the alternating stack (30, 60) and the second memory level dielectric material layer 190B. In one embodiment, the etch stop dielectric layer 192 can be employed as an etch stop layer for the second anisotropic etch process. For example, the dielectric hard mask layer 193 and the etch stop dielectric layer 192 can include a dielectric metal oxide (such as aluminum oxide) or silicon nitride, and the etch chemistry of the second anisotropic etch process can be selective to the material(s) of the sacrificial spacers 65, the dielectric hard mask layer 193 and the etch stop dielectric layer 192. The sidewalls of each cavity 69' can vertically extend through the dielectric hard mask layer 193, the third memory level dielectric material layer 190D, the memory level dielectric material portion 190C, a respective portion of the alternating stack (30, 60), and the second memory level dielectric material layer 190B, and can terminate on a surface of the etch stop dielectric layer 192. The sidewalls of each cavity 69' can be vertical, or can have a taper angle less than 5 degrees.

The portion of each cavity 69' extending through the alternating stack (30, 60) and the second memory level dielectric material layer 190B, and an upper portion of the etch stop dielectric layer 192 is herein referred to as a lower contact via cavity. Each lower contact via cavity is formed through a subset of the electrically conductive layers 30 that underlie the respective sacrificial spacer 65 by the second anisotropic etch process.

Figure 9:
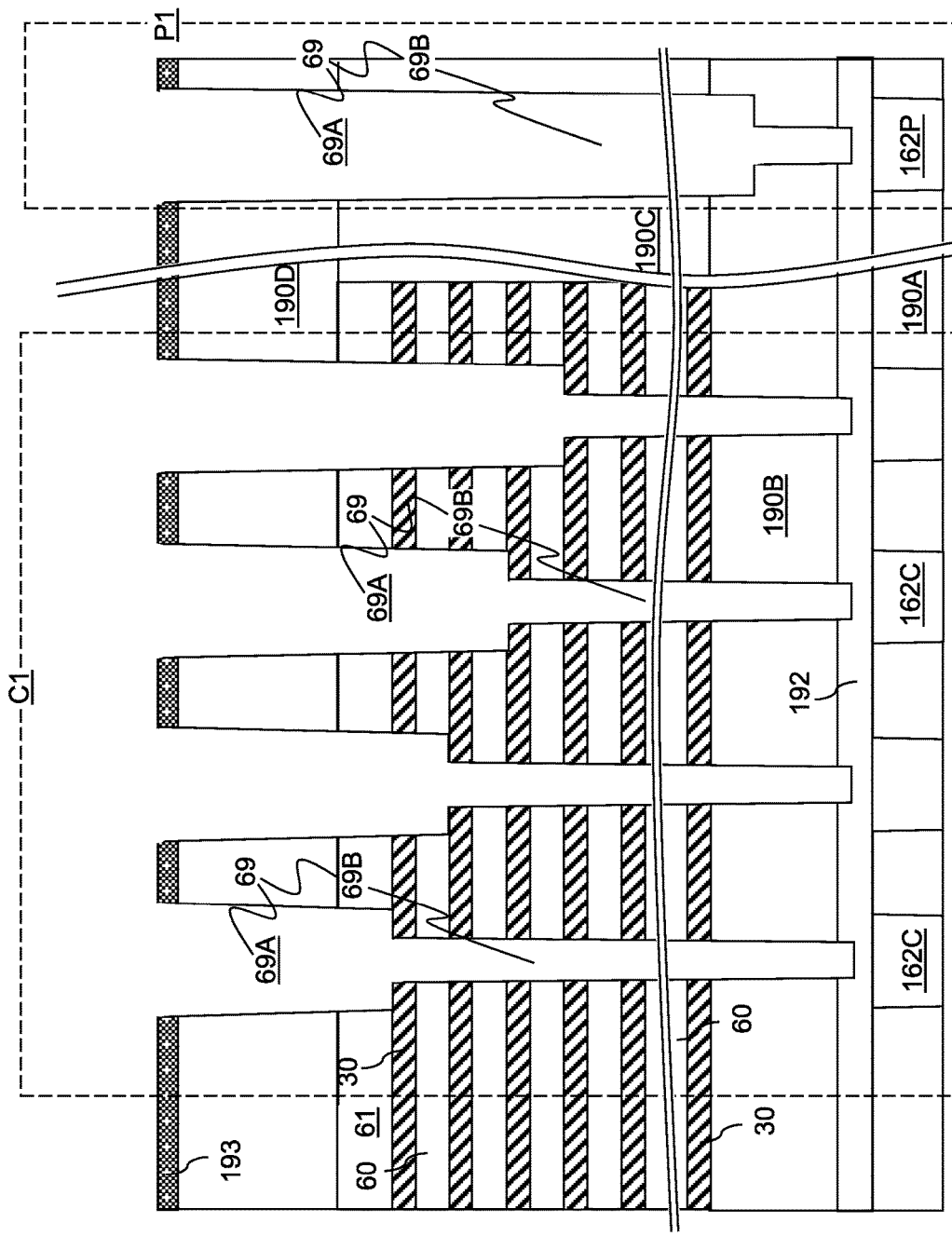
FIG. 9 is a vertical cross-sectional view of the contact region and the peripheral device region after removal of the sacrificial spacers according to the first embodiment of the present disclosure.

Referring to FIG. 9, the sacrificial spacers 65 can be removed selective to the materials of the dielectric hard mask layer 193, the third memory level dielectric material layer 190D, the memory level dielectric material portion 190C, the alternating stack (30, 60), the second memory level dielectric material layer 190B, and the etch stop dielectric layer 192. For example, if the sacrificial spacers 65 include amorphous carbon or silicon nitride, then the sacrificial spacers 65 can be removed by ashing or by a hot phosphoric acid solution wet etch, respectively. If the sacrificial spacers 65 include amorphous silicon or polysilicon, then the sacrificial spacers 65 can be removed by a wet etch employing a KOH solution.

Integrated contact via cavities 69 are formed from the volumes of the cavities 69' as vertically extended at the processing steps of FIG. 8 and the volumes from which the sacrificial spacers 65 are removed. Each integrated contact via cavity 69 is a two-stage contact via cavity that includes an upper contact via cavity 69A and a lower contact via cavity 69B and a horizontal step between them exposing the top surface of one of the electrically conductive layers 30.

Figure 10:
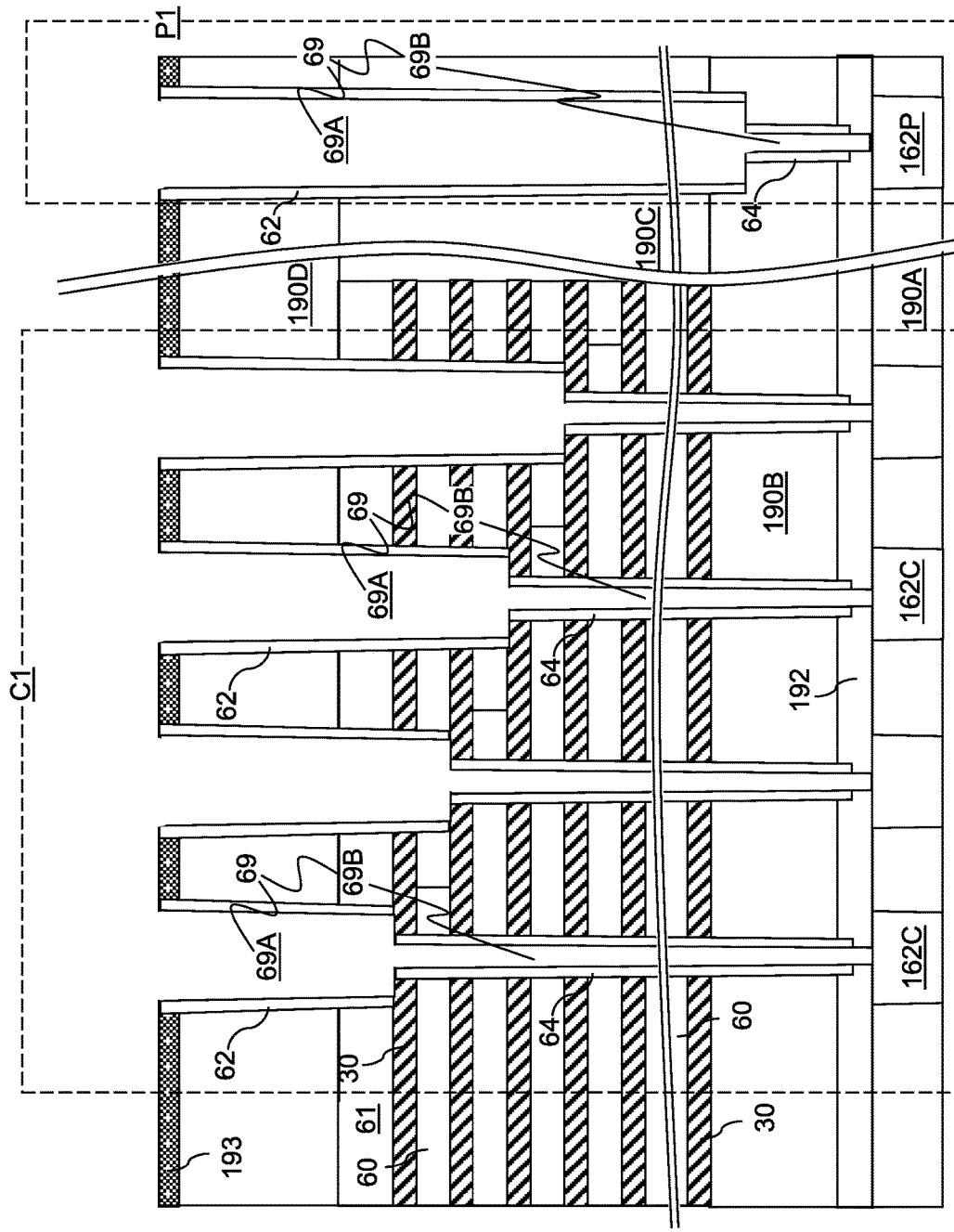
FIG. 10 is a vertical cross-sectional view of the contact region and the peripheral device region after formation of an upper insulating spacer and a lower insulating spacer within each contact via cavity and physical exposure of top surfaces of the underlying conductive structures according to the first embodiment of the present disclosure.

Referring to FIG. 10, a conformal dielectric material layer can be formed in the upper contact via cavities 69A, in the lower contact via cavities 69B, and over the memory level dielectric material layers (190A, 102, 190B, 109C, 190D, 193) as a continuous material layer. The conformal dielectric material layer includes a dielectric material such as silicon oxide, silicon nitride, or a dielectric metal oxide, and can be deposited employing a conformal deposition method such as chemical vapor deposition (CVD) or atomic layer deposition (ALD). The thickness of the conformal dielectric material layer can be less than one half of the difference between the width of an upper contact via cavity 69A (as measured at the bottom of the upper contact via cavity 69A) and the width of an underlying lower contact via cavity 69B (as measured at the top of the lower contact via cavity 69B)

The conformal dielectric material layer can be anisotropically etched to remove the horizontal portions of the conformal dielectric material layer over the top of the alternating stack and over the horizontal steps to expose the top surface of a respective electrically conductive layer 30. A first remaining tubular portion of the conformal dielectric material layer within each upper contact via cavity 69A constitutes an upper insulating spacer 62. A second remaining tubular portion of the conformal dielectric material layer within each lower contact via cavity 69B constitutes a lower insulating spacer 64. Thus, upper insulating spacers 62 and lower insulating spacers 64 are formed in the upper contact via cavities 69A and in the lower contact via cavities 69B, respectively, by anisotropically etching the conformal dielectric material layer. The each pair of upper insulating spacer 62 and the lower insulating spacer 64 is separated by the horizontal step which exposes the top surface of a respective electrically conductive layer 30.

The anisotropic etch can be extended to remove the portions of the etch stop dielectric layer 192 from underneath each lower contact via cavity 69B. Top surfaces of the underlying conductive structures, i.e., the memory level contact region conductive structures 162C, can be physically exposed at the bottom of each lower contact via cavity 69B by extending the integrated contact via cavities 69 through the optional etch stop dielectric layer 192. An upper insulating spacer 62 and a lower insulating spacer 64 are formed within each integrated contact via cavity 69. The lower insulating spacers 64 do not physically contact the upper insulating spacers 62 because they are separated by the horizontal step which exposes the top surface of a respective electrically conductive layer 30.

The top surface (e.g., an annular surface) of an electrically conductive layer 30 can be physically exposed at the bottom of each upper contact via cavity 69A within the integrated contact via cavities 69 in the contact region C. The lower contact via cavity 69B that is adjoined to the upper contact via cavity 69A vertically extends through those layers of the alternating stack (30, 60) that include the electrically conductive layer 30 having the annular physically exposed top surface and the underlying layers and through the second memory level dielectric material layer 190B and to a top surface of an underlying conductive structures 162C.

Figure 11:
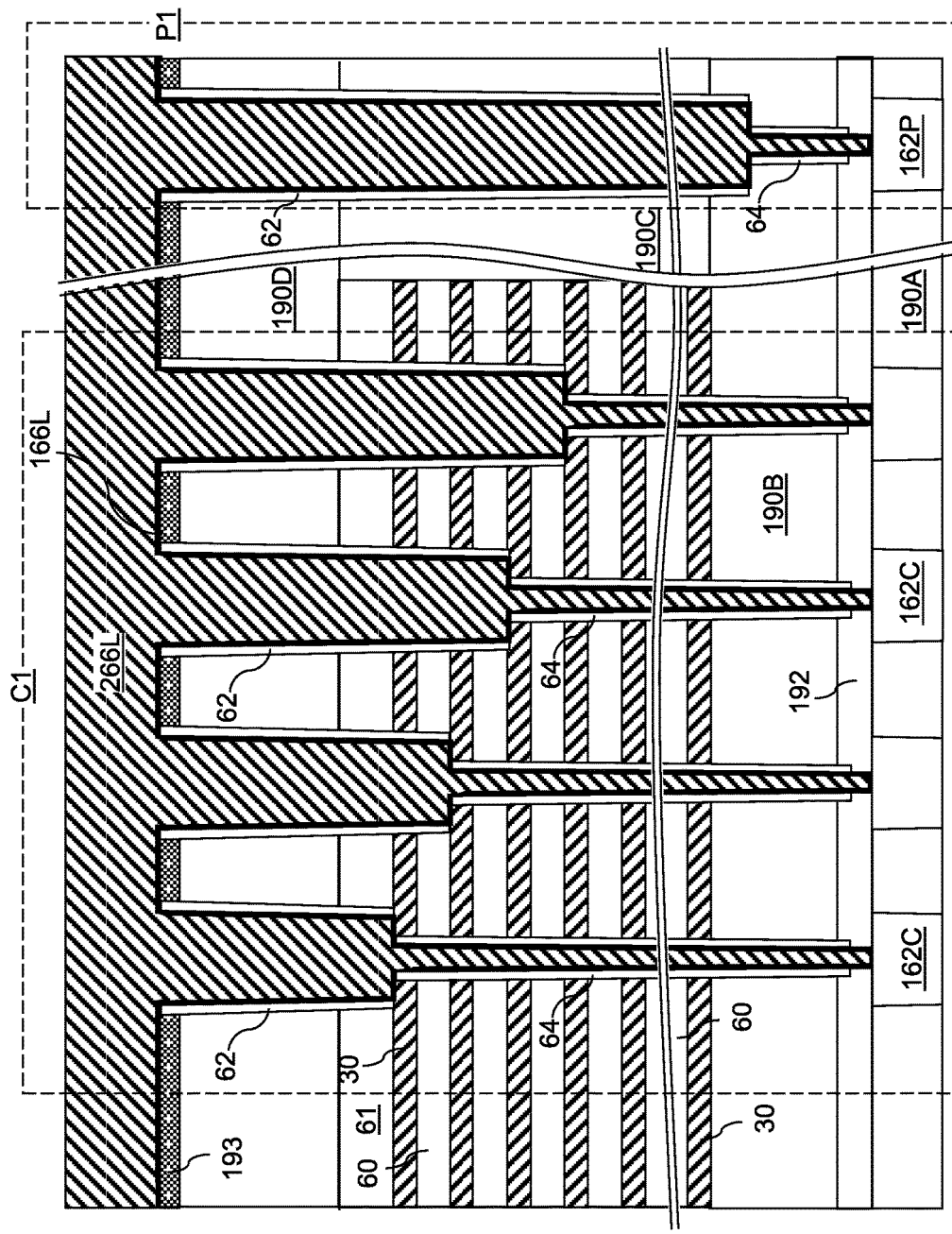
FIG. 11 is a vertical cross-sectional view of the contact region and the peripheral device region after deposition of via fill conductive materials according to the first embodiment of the present disclosure.

Referring to FIG. 11, at least one conductive material is deposited within the integrated contact via cavities 69. The at least one conductive material can include, for example, a metallic liner layer 166L and a metallic fill material layer 266L. The metallic liner layer 166L can include a metallic diffusion barrier material and/or a metallic adhesion promotion material. For example, the metallic liner layer 166L can include at least one metallic nitride material such as TiN, TaN, and WN. The metallic liner layer 166L can be deposited by a conformal deposition method (such as chemical vapor deposition or electroplating) and/or non-conformal deposition method (such as physical vapor deposition). The thickness of the metallic liner layer 166L, as measured at vertical portions, can be in a range from 5 nm to 100 nm, although lesser and greater thicknesses can also be employed. The metallic fill material layer 266L can include an elemental metal, an intermetallic alloy, and/or a conductive metallic compound of at least one metal and at least one non-metallic element (such as nitrogen or carbon). For example, the metallic fill material layer 266L can include copper and/or tungsten. The metallic fill material layer 266L can be deposited by chemical vapor deposition or electroplating. In one embodiment, the metallic fill material layer 266L can consist essentially of copper or tungsten.

Figure 12:
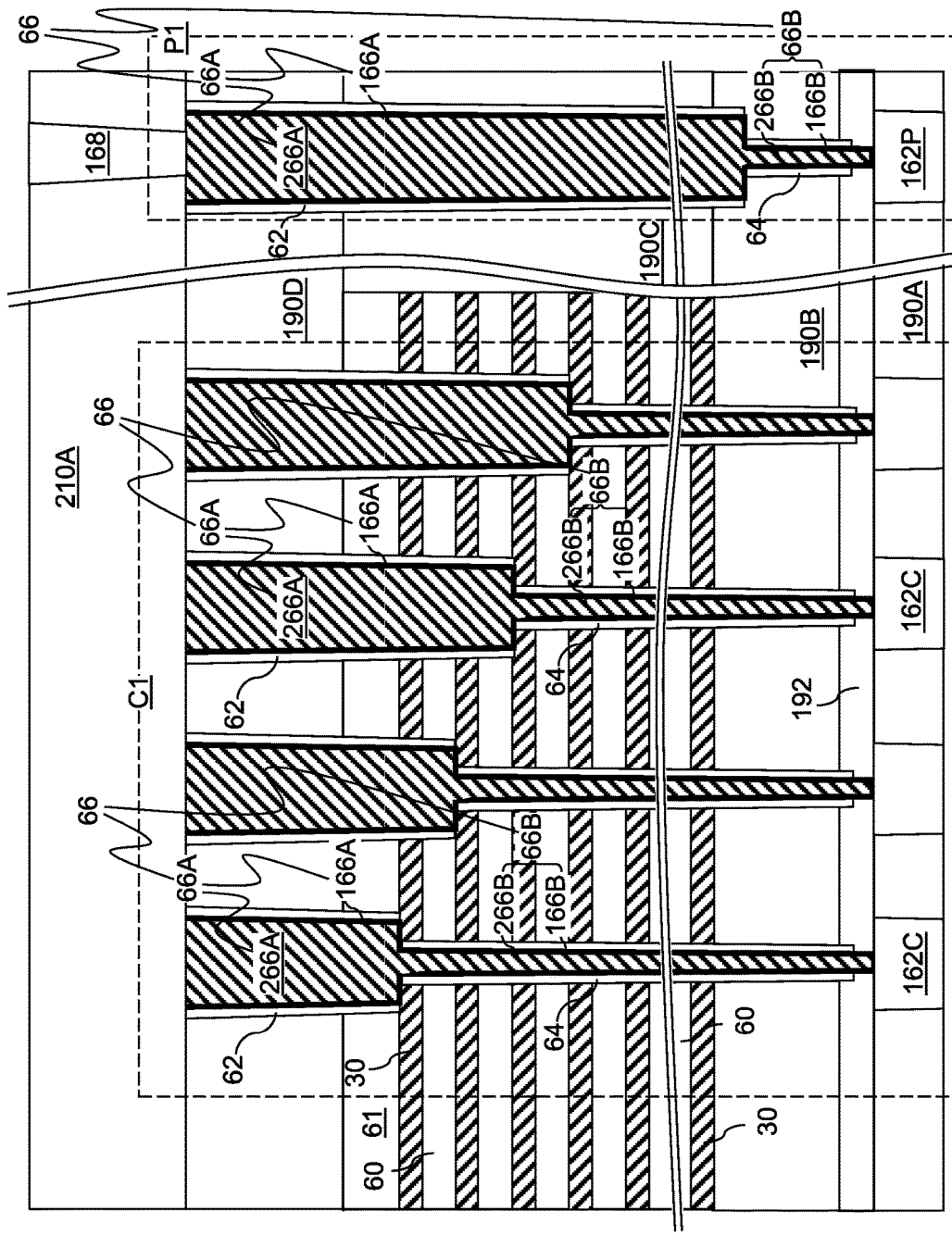
FIG. 12 is a vertical cross-sectional view of the contact region and the peripheral device region after formation of two-stage contact via structures, an upper interconnect dielectric layer, and an upper interconnect level contact via structure according to the first embodiment of the present disclosure.
Figure 13A:
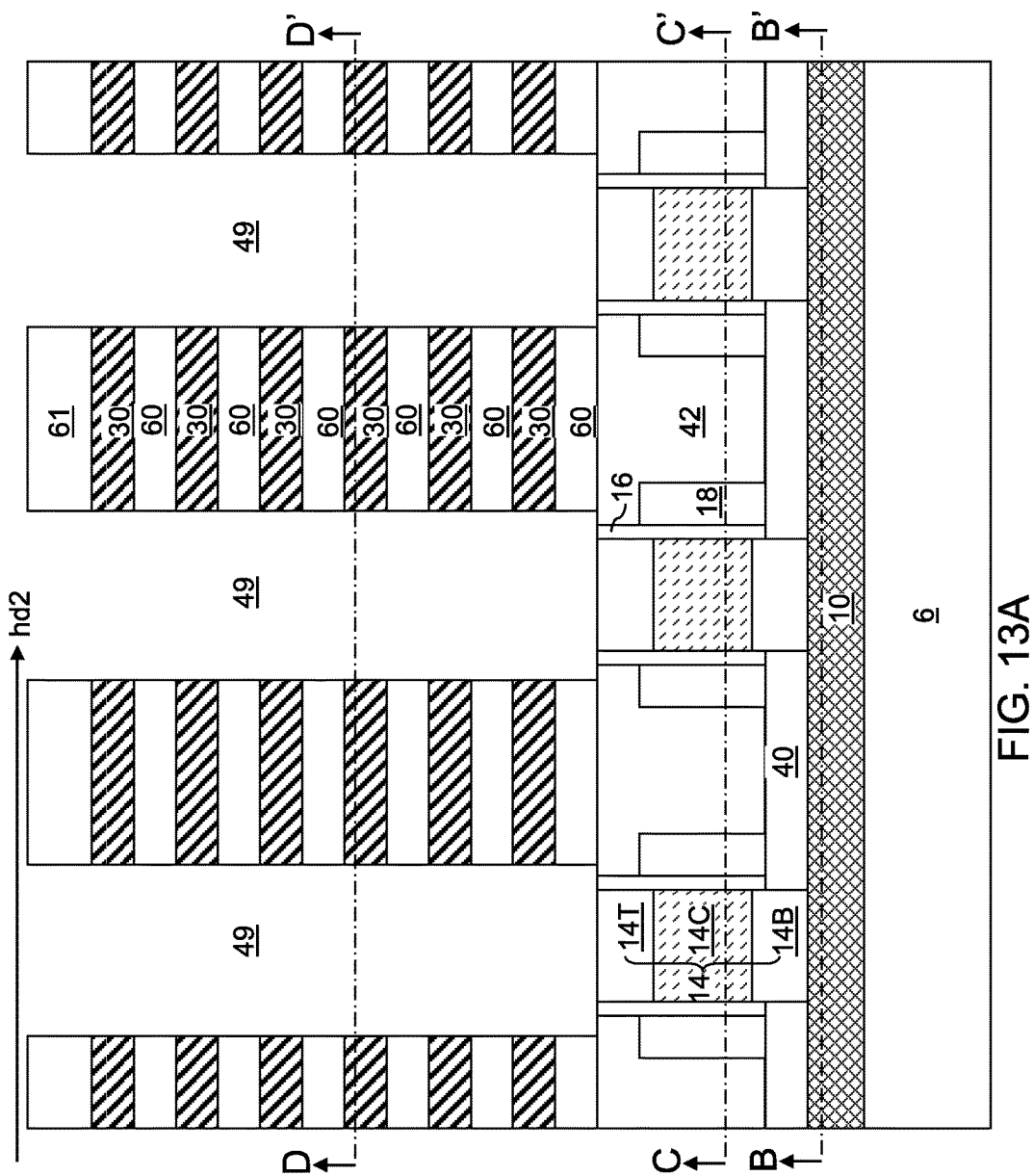
FIG. 13A is a vertical cross-sectional view of an array region of the first exemplary structure for forming a resistive random access memory device after formation of bit line access transistors, a dielectric fill layer, and a patterned alternating stack of insulating layers and conductive material layers according to a first embodiment of the present disclosure.
Figure 13B:
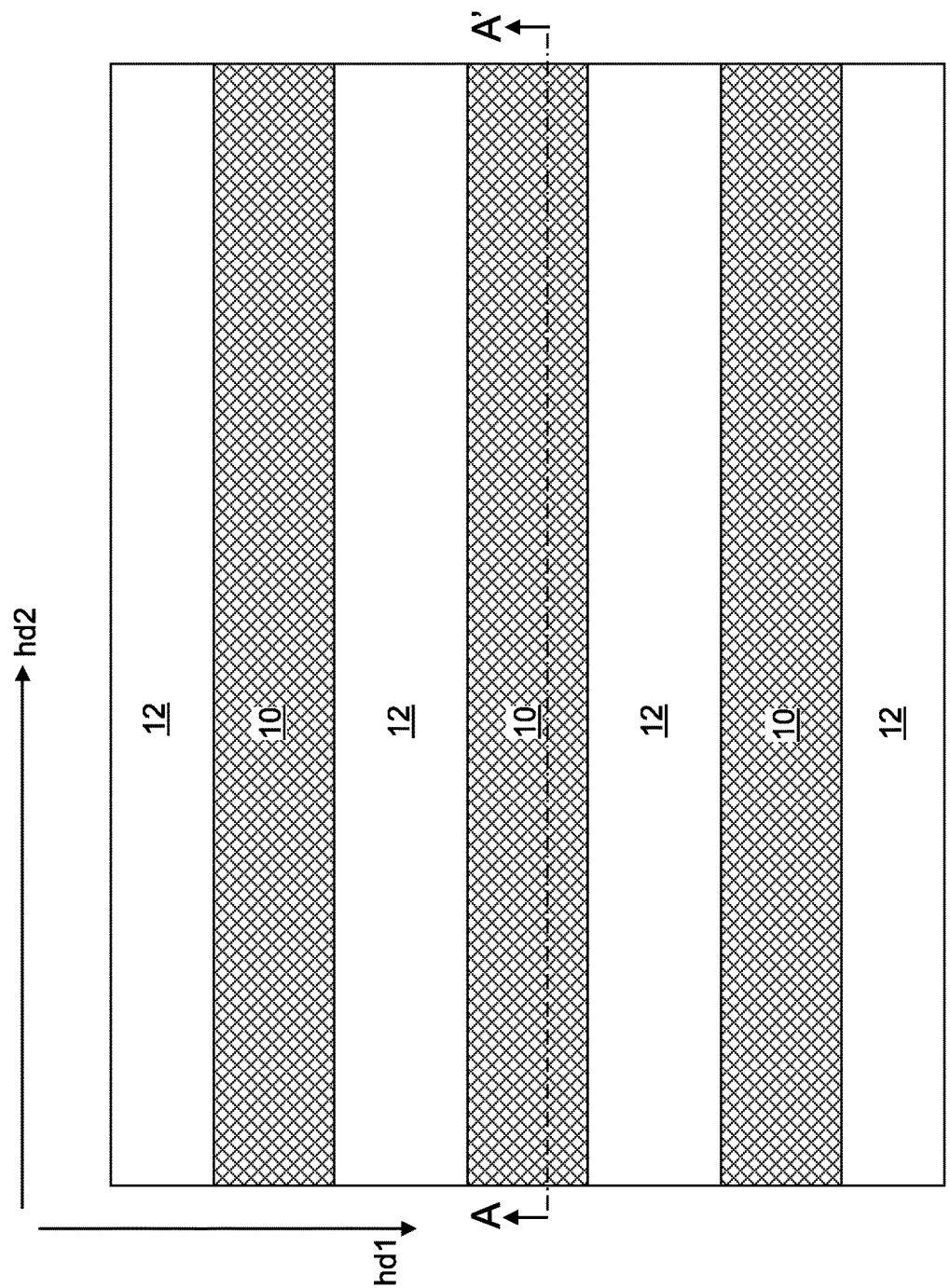
FIG. 13B is a horizontal cross-sectional view of the array region of the first exemplary structure of FIG. 13A along the horizontal plane B-B'. The vertical plane A-A' is the plane of the cross-section for FIG. 13A.
Figure 13C:
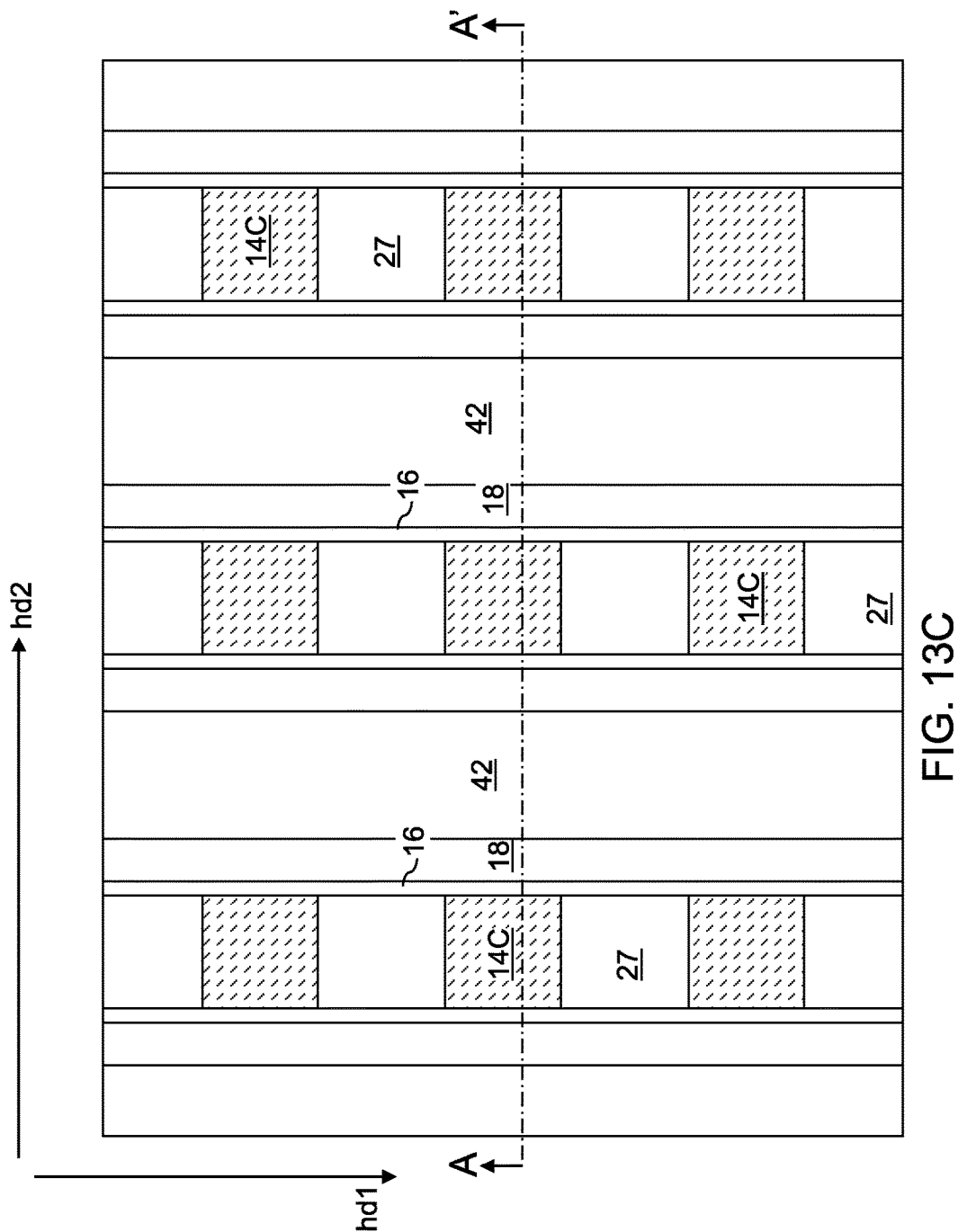
FIG. 13C is a horizontal cross-sectional view of the array region of the first exemplary structure of FIG. 13A along the horizontal plane C-C'. The vertical plane A-A' is the plane of the cross-section for FIG. 13A.
Figure 13D:
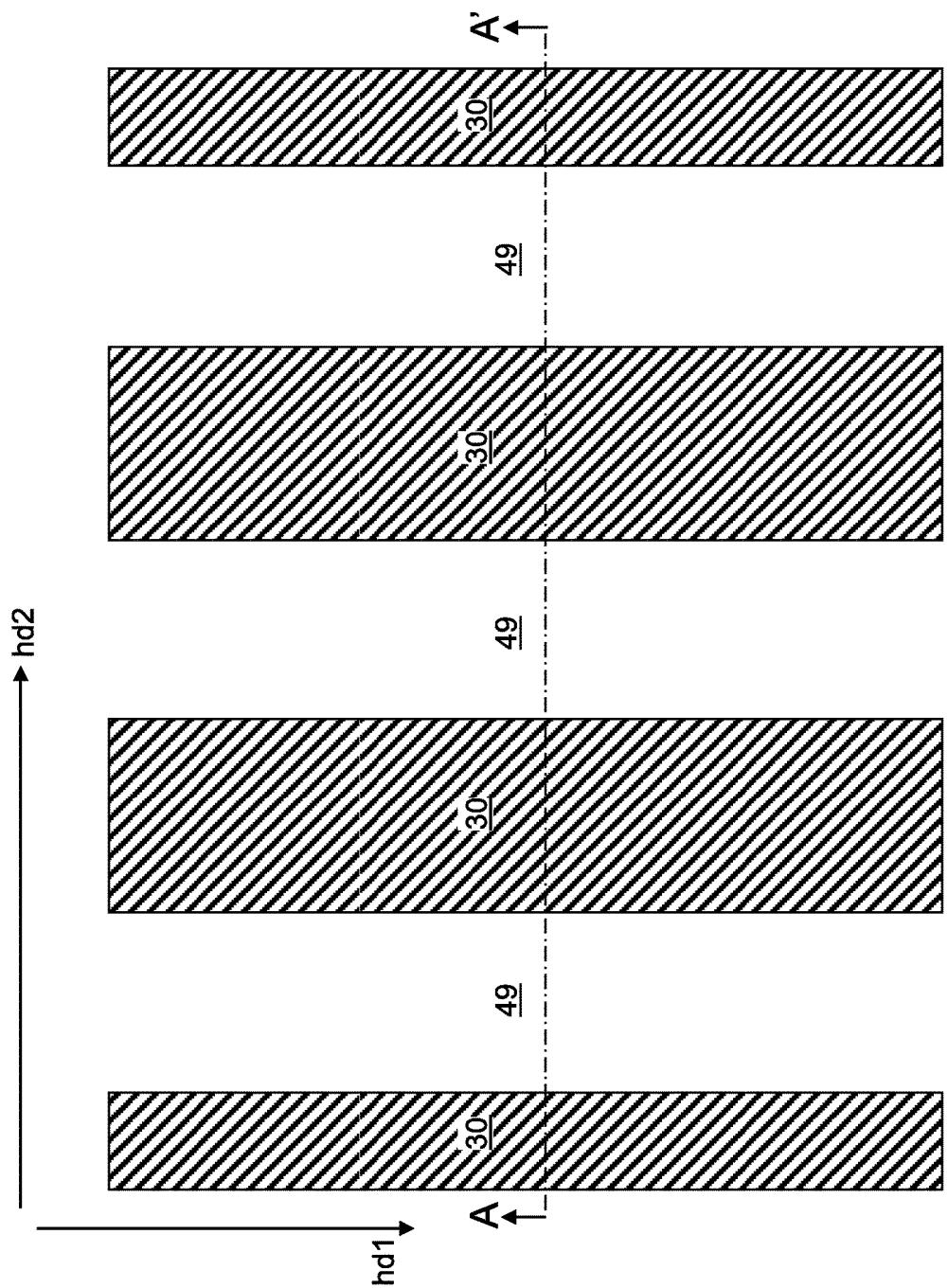
FIG. 13D is a horizontal cross-sectional view of the array region of the first exemplary structure of FIG. 13A along the horizontal plane D-D'. The vertical plane A-A' is the plane of the cross-section for FIG. 13A.

Referring to FIG. 12, a planarization process can be performed to remove horizontal portions of the metallic fill material layer 266L and the metallic liner layer 166L from above the horizontal plane including the top surface of the dielectric hard mask layer 193. The planarization process can employ chemical mechanical planarization (CMP) and/or a recess etch. The dielectric hard mask layer 193 can be employed as a stopping material layer during the CMP process and/or as an etch stop layer during the recess etch. The dielectric hard mask layer 193 can be subsequently removed, for example, by an isotropic etch such as a wet etch. Optionally, the materials of the metallic fill material layer 266L and the metallic liner layer 166L can be removed from above the horizontal plane including the top surface of the third memory level dielectric material layer 190D by a recess etch.

Each remaining portion of the metallic fill material layer 266L and the metallic liner layer 166L within an integrated contact via cavity constitutes a conductive via structure 66, which is a two-stage contact via structure. Thus, the deposited at least one conductive material within the upper insulating spacers 62 and lower insulating spacers 64 forms the conductive via structures 66.

Each conductive via structure 66 includes an upper conductive via portion 66A that is formed directly on, and over, the top surface of the respective one of the electrically conductive layers 30, and a lower conductive via portion 66B that is formed between a horizontal plane including the top surface of the respective one of the electrically conductive layers 30 and a horizontal plane including the top surface of the respective one of the conductive structures that underlie the contact region C of the alternating stack (30, 60), i.e., the respective one of the memory level contact region conductive structures 162C. The upper conductive via portion 66A has a greater width than the lower conductive via portion 66B. Specifically, the smallest width of the upper conductive via portion 66A (e.g., at the bottom of portion 66A) can be greater than the greatest width of the lower conductive via portion 66B (e.g., at the top of portion 66B). Each conductive via structure 66 can be formed as an integral structure (i.e., a single continuous structure). As such, each upper conductive via portion 66A is adjoined to an underlying lower conductive via portion 66B.

Each conductive via structure 66 is formed directly on a respective one of the electrically conductive layers 30. Specifically, each conductive via structure 66 is formed directly on a top surface of a respective one of the electrically conductive layers 30 and directly on a top surface of a respective one of the conductive structures 162C, and is electrically insulated by the lower insulating spacers 64 and the upper insulating spacers 62 from a respective subset of the electrically conductive layers 30 that is located between the respective one of the electrically conductive layers 30 (i.e., the one that the conductive via structure 66 physically contacts) and the conductive structures 162C. The conductive structures 66 are formed on horizontal surfaces of the electrically conductive layers 30 within the contact region C.

Each conductive via structure 66 includes a metallic liner (166A, 166B) including an upper metallic liner portion 166A that is included in an upper conductive via portion 66A and a lower metallic liner portion 166B that is included in a lower conductive via portion 66B. The upper metallic liner portion 166A includes a first vertically extending portion overlying the top surface of the respective one of the electrically conductive layers 30, and a first horizontal portion (which is an annular portion) physically contacting the top surface of the respective one of the electrically conductive layers 30. The lower metallic liner portion 166B includes a second vertically extending portion extending between the top surface of the respective one of the electrically conductive layers 30 and the top surface of the respective one of the conductive structures 162C, and a second horizontal portion that physically contacts the top surface of the respective one of the conductive structures 162C. Each metallic liner (166A, 166B) is a single continuous structure including an opening at a top end.

Each conductive via structure 66 includes a conductive fill material portion (266A, 266B), which includes a first conductive fill material sub-portion 266A overlying a horizontal plane including the top surface of the respective one of the electrically conductive layers 30 and a second conductive fill material sub-portion 266B underlying the horizontal plane including the top surface of the respective one of the electrically conductive layers 30. As used herein, a "sub-portion" refers to a segment of a portion that is less than the portion. Each conductive fill material portion (266A, 266B) is a single continuous structure.

In one embodiment, an inner periphery of a physical contact area between a metallic liner (166A, 166B) and the top surface of the respective one of the electrically conductive layers 30 can be spaced from an outer periphery of the physical contact area by a uniform lateral distance. This is because the lateral offset between the sidewall of the upper contact via cavity 69A and the sidewall of the lower contact via cavity 69B is determined by the thickness of the sacrificial spacers 65, which has the same thickness that is independent of the azimuthal angle around a vertical axis passing through the geometrical center of the integrated contact via cavity 69.

Subsequently, a first upper interconnect level dielectric material layer 210A can be formed over the third memory level dielectric material layer 190D as a component of the upper interconnect level dielectric material layers 210. Upper interconnect level via structures 168 can be formed within the first upper interconnect level dielectric material layer 210A.

FIGS. 13A-13D, 14A-14B, 15A-15B, and 16A-16B illustrate the process of forming a vertical bit line type resistive random access memory device that is incorporated into the first exemplary structures of FIGS. 1A and 1B. While incorporation of the resistive random access memory device into the array region A of the first exemplary structure is illustrated herein, it is understood that the present invention can be employed to incorporate any other type of three-dimensional memory device employed an alternating stack of insulating layers 60 and electrically conductive layers 30 and memory structures vertically extending through the alternating stack (30, 60).

Referring to FIGS. 13A-13D, the array region A of the first exemplary structure of FIG. 1A or 1B includes a memory level bottom dielectric layer 6, which may, or may not, be the same as the first memory level dielectric material layer 190A. Global bit lines 10 are formed over the memory level bottom dielectric layer 6. The global bit lines 10 can be a subset of the memory level array region conductive structures 162A and/or the lower level interconnect structures 170 illustrated in FIGS. 1A and 1B. The global bit lines 10 are parallel electrically conductive lines that are laterally spaced apart in a first horizontal direction hd1, and extending in a second horizontal direction hd2. The global bit lines 10 can be formed, for example, by depositing at least one conductive material layer, and patterning the at least one conductive material layer employing a combination of lithographic methods and an anisotropic etch. The at least one conductive material layer can include, for example, at least one elemental metal (such as W, Co, Cu, and Al), a conductive doped semiconductor material, an intermetallic alloy including at least two elemental metals, a conductive metallic nitride, or a conductive metallic carbide. For example, the at least one conductive material layer can include a metallic barrier layer (such as a layer of TiN, TaN, or WN) and a metal layer (such as a layer of W, Ti, Ta, Cu, Al, or an alloy thereof). The space between the global bit lines 10 can be filled with a dielectric material (such as silicon oxide). The dielectric material can be subsequently planarized to remove excess portions from above a horizontal plane including the top surfaces of the global bit lines 10 to form separator dielectric material portions 12. Each global bit lines 10 and each separator dielectric material portions 12 can extend along the second horizontal direction hd2. A one-dimensional array of the global bit lines 10 and the separator dielectric material portions 12 can extend along the first horizontal direction hd2 with a periodicity that is equal to the sum of the width of a global bit line 10 and the width of a separator dielectric material portion 12. Alternatively, the one-dimensional array of the global bit lines 10 and the separator dielectric material portions 12 may be formed by depositing a dielectric material layer, forming trenches extending along the second horizontal direction hd2 and laterally spaced from one another along the first horizontal direction hd1, and filling the trenches with at least one conductive material to form the global bit lines 10 therein.

A two-dimensional array of select devices can be formed on the global bit lines 10 such that multiple select devices are formed on each global bit line 10. In one embodiment, the select devices can be transistor such as vertical thin film transistors employing a polycrystalline semiconductor channel. Examples of suitable transistors for the select devices are described, for example, in U.S. patent application Ser. No. 14/206,196, filed Mar. 12, 2014, which is incorporated by reference herein in its entirety. In case the select devices are field effect transistors, the select transistors are herein referred to access transistors.

Bit line access transistors are subsequently formed on global bit line 10. Each access transistor can be a vertical field effect transistor, and can include a bottom active region 14B (which can be a source region or a drain region), a semiconductor channel 14C, and a top active region 14T (which can be a drain region if the underlying bottom active region 14B is a source region, and a source region if the underlying bottom active region 14C is a drain region). As used herein, an "active region" refers to a source region or a drain region.

The bit line access transistors can be formed by forming a semiconductor portion stack 14 including a first doped semiconductor layer for forming the bottom active regions 14B, a semiconductor channel material layer for forming the semiconductor channels 14C, and a second doped semiconductor layer for forming the top active regions 14T, which has a same type of doping as the first doped semiconductor layer. The semiconductor portion stack 14 is patterned employing a combination of lithographic methods and an anisotropic etch such that each patterned portion of the semiconductor portion stack 14 overlies an area of a respective global bit line 10 and is laterally spaced from one another by trenches extending along the second horizontal direction hd2. Subsequently, a dielectric material (such as silicon nitride and/or silicon oxide) is deposited in the trenches and planarized to remove the dielectric material from above rails of the semiconductor portion stack 14 that extend along the second horizontal direction hd2. The remaining portions of the semiconductor portion stack 14 and the planarized dielectric material portions constitute alternating rail structures in which rails of semiconductor portion stack 14 and rails of the planarized dielectric material extend along the second horizontal direction hd2 and alternate along the first horizontal direction hd1.

The remaining portions of the semiconductor portion stack 14 and the planarized dielectric material portions are patterned to form trenches that extend along the first horizontal direction hd1. Each patterned portion of the semiconductor portion stack 14 includes a vertical stack of a bottom active region 14B, a semiconductor channel 14C, and a top active region 14T. Each patterned portion of the dielectric material constitutes a dielectric pillar structure 27, which can be located between a pair of vertical stacks of a bottom active region 14B, a semiconductor channel 14C, and a top active region 14T that are spaced from each other along the first horizontal direction hd1. Each alternating sequence of dielectric pillar structures 27 and vertical stacks of a bottom active region 14B, a semiconductor channel 14C, and a top active region 14T that extend along the first horizontal direction hd1 forms a composite rail structure (14B, 14C, 14T, 27). The composite rail structures (14B, 14C, 14T, 27) are laterally spaced from one another along the second horizontal direction hd2. Top surfaces of the global bit lines 10 and the separator dielectric portions 12 can be physically exposed at the bottom of each trench that laterally extends along the first horizontal direction hd1.

A spacer dielectric layer 40 can be formed at the bottom the trenches by depositing a self-planarizing dielectric material (such as spin-on glass) or by filling the trenches with a dielectric material (such as organosilicate glass), planarizing the deposited dielectric material, and recessing the dielectric material selective to the dielectric pillar structures 27 and the vertical stacks of the bottom active regions 14B, the semiconductor channels 14C, and the top active regions 14T. Each spacer dielectric layer 40 can be formed over of the global bit lines 10 and the separator dielectric material portions 12 such that the top surface of the spacer dielectric layer 40 is located at a target height for placing a bottom edge of gate electrodes 18 to be subsequently formed. For example, the top surface of the spacer dielectric layer 40 can be at a level about the interface between the remaining portions of the first conductivity type semiconductor layer and the channel material layer.

The gate dielectrics 16 and the gate electrodes 18 of the access transistors can be subsequently formed, for example, by depositing a conformal gate dielectric layer (e.g., silicon oxide) and a conformal conductive material layer (e.g., heavily or degenerately doped polysilicon) in the trenches that separate the one-dimensional array of rail structures, and by anisotropically etching the conformal conductive material layer. The remaining vertical portions of the conformal conductive material layer constitute the gate electrodes 18, which extend along the first horizontal direction hd1. Each remaining portion of the conformal gate dielectric layer constitutes a gate dielectric 16. Each gate electrode 18 is laterally spaced from an adjacent rail structure by a vertical portion of a gate dielectric 16.

Remaining volumes of the trenches are filled with at least one dielectric material. Excess portions of the at least one dielectric material can be removed from above the horizontal plane including the top surfaces of the rail structures (which include contiguous portions of the semiconductor portion stack 14 and the dielectric pillar structures 27 that are present between a pair of trenches) by a planarization process, which can employ, for example, chemical mechanical planarization. Each remaining portion of the deposited dielectric material in the trenches constitutes a dielectric rail structure 42.

Each dielectric rail structure 42 extends along the first horizontal direction hd1 parallel to the composite rail structures (14B, 14C, 14T, 27). Each composite rail structure (14B, 14C, 14T, 27) includes remaining portions of the semiconductor portion stack 14 and the dielectric pillar structures 27 between a neighboring pair of dielectric rail structures 42. Each dielectric rail structure 42 can have a substantially vertical bottom portion, or can have a tapered bottom portion in which the width of the dielectric rail structure 42 monotonically or strictly increases as a function of a vertical distance from the memory level bottom dielectric layer 6. In one embodiment, each dielectric rail structure 42 can include at least one dielectric material such as silicon nitride and/or silicon oxide. The dielectric rail structures 42 and the composite rail structures (14T, 14C, 14B, 27) alternate along the second horizontal direction hd2.

Subsequently, an alternating stack of spacer material layers and insulating layers 60 can be formed over the one dimensional array of the dielectric rail structures 42 and the composite rail structures (14B, 14C, 14T, 27). An insulating cap layer 61 can be formed over the alternating stack. In one embodiment, the spacer material layers can be electrically conductive layers 30 that remain in a final device structure. In another embodiment, the spacer material layers can be sacrificial material layers that are subsequently replaced with electrically conductive layers, as will be described in more detail below. In one embodiment, the insulating cap layer 61 can include a dielectric material that is different from the dielectric material of the insulating layers 60. For example, the insulating layers 60 can include undoped silicate glass (e.g., silicon oxide) or doped silicate glass, and the insulating cap layer 61 can include silicon nitride or a dielectric metal oxide.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of the electrically conductive layers and the insulating layers may begin with an instance of the electrically conductive layers or with an instance of the insulating layers, and may terminate with an instance of the electrically conductive layers or with an instance of the insulating layers. In one embodiment, an instance of the first elements and an instance of the second elements may form a unit that is repeated with periodicity within the alternating plurality.

Subsequently, the insulating cap layer 61 and the alternating stack of the electrically conductive layers 30 and the insulating layers 60 can be patterned to form line trenches 49 that extend along the first horizontal direction hd1. Each line trench 49 can overlie the area of a respective composite rail structure (14B, 14C, 14T, 27). Each contiguous set of remaining portions of the electrically conductive layers 30 and the insulating layers 60 between a pair of line trenches 49 constitutes an alternating stack (30, 60) that is a rail structure. Each alternating stack (30, 60) overlies a respective dielectric rail structure 42, extends along the first horizontal direction hd1, and is laterally spaced apart from other alternating stacks (30, 60) along the second horizontal direction hd2. Each patterned electrically conductive layer 30 can constitute a word line of a resistive random access memory device. In one embodiment, each alternating stack (30, 60) can have a lesser width along the second horizontal direction hd2 than the underlying dielectric rail structure 42, and can be entirely within the area of the underlying dielectric rail structure 42.

In one embodiment, the electrically conductive layers 30 comprise a first electrically conductive material. In one embodiment, the first electrically conductive material can include an elemental metal, an intermetallic alloy, and/or a conductive metal nitride.

The thickness of the electrically conductive layers 30 can be in a range from 5 nm to 60 nm, although lesser and greater thicknesses can also be employed. The thickness of the insulating lines 60 can be in a range from 5 nm to 60 nm, although lesser and greater thicknesses can also be employed. The thickness of the insulating cap layer 61 can be in a range from 5 nm to 300 nm, although lesser and greater thicknesses can also be employed.

A pair of a conductive material layer 30 and an insulating layer 60 can constitute a unit of repetition in the alternating stack (30, 60) of the electrically conductive layers 30 and the insulating layers 60. The total number of repetitions can be in a range from 8 to 1,024, although lesser and greater number of repetitions can also be employed. Thus, a plurality of alternating stacks (30, 60) of insulating layers 60 and electrically conductive layers 30 is formed over a memory level bottom dielectric layer 6. Each of the insulating layers 60 and the electrically conductive layers 30 extends along the first horizontal direction (i.e., the word line direction) hd1. The alternating stacks (30, 60) are laterally spaced from one another along the second horizontal direction hd2 (i.e., the global bit line direction).

Figure 14A:
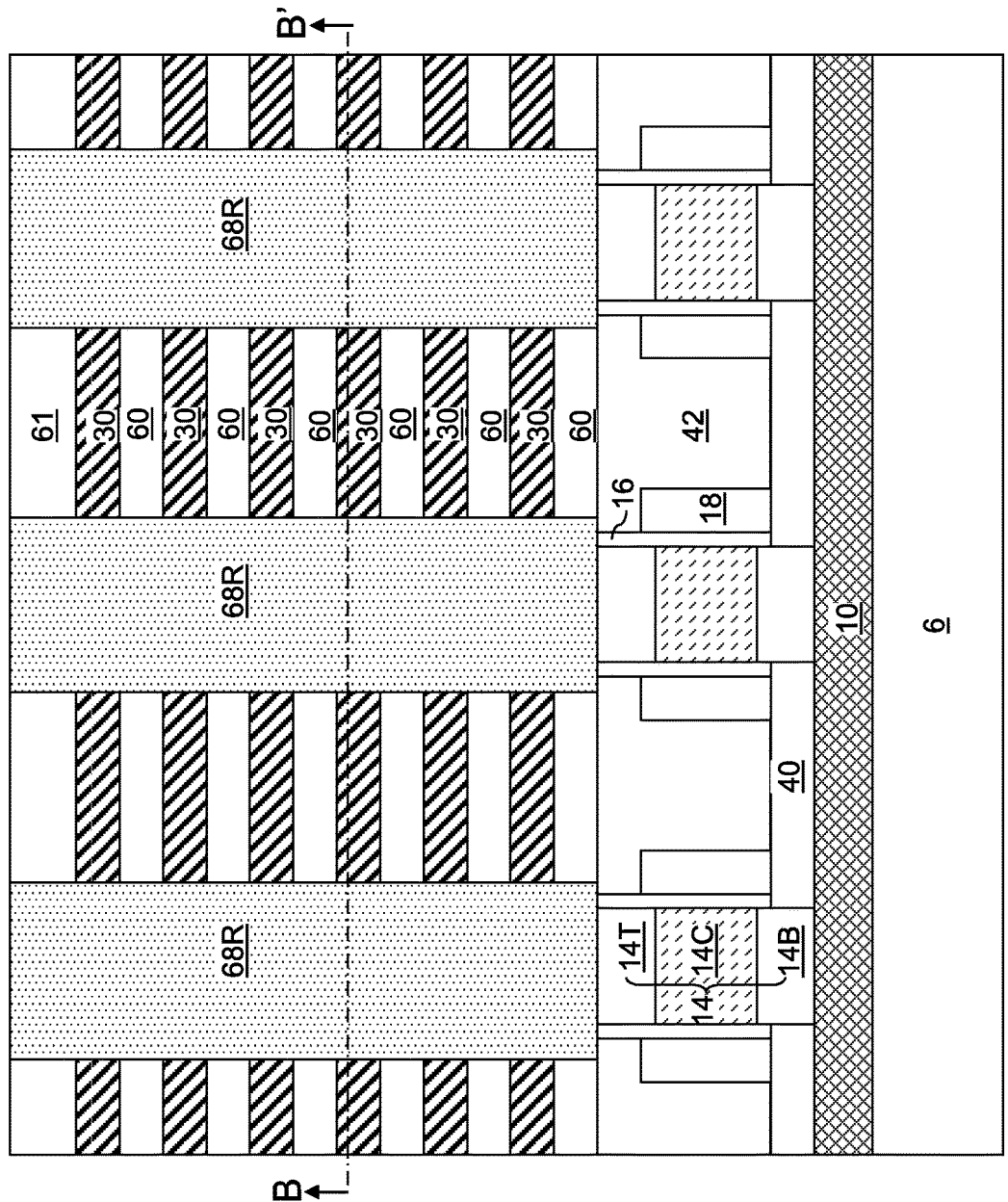
FIG. 14A is a vertical cross-sectional view of the array region of the first exemplary structure after formation of dielectric trench fill structures according to an embodiment of the present disclosure.
Figure 14B:
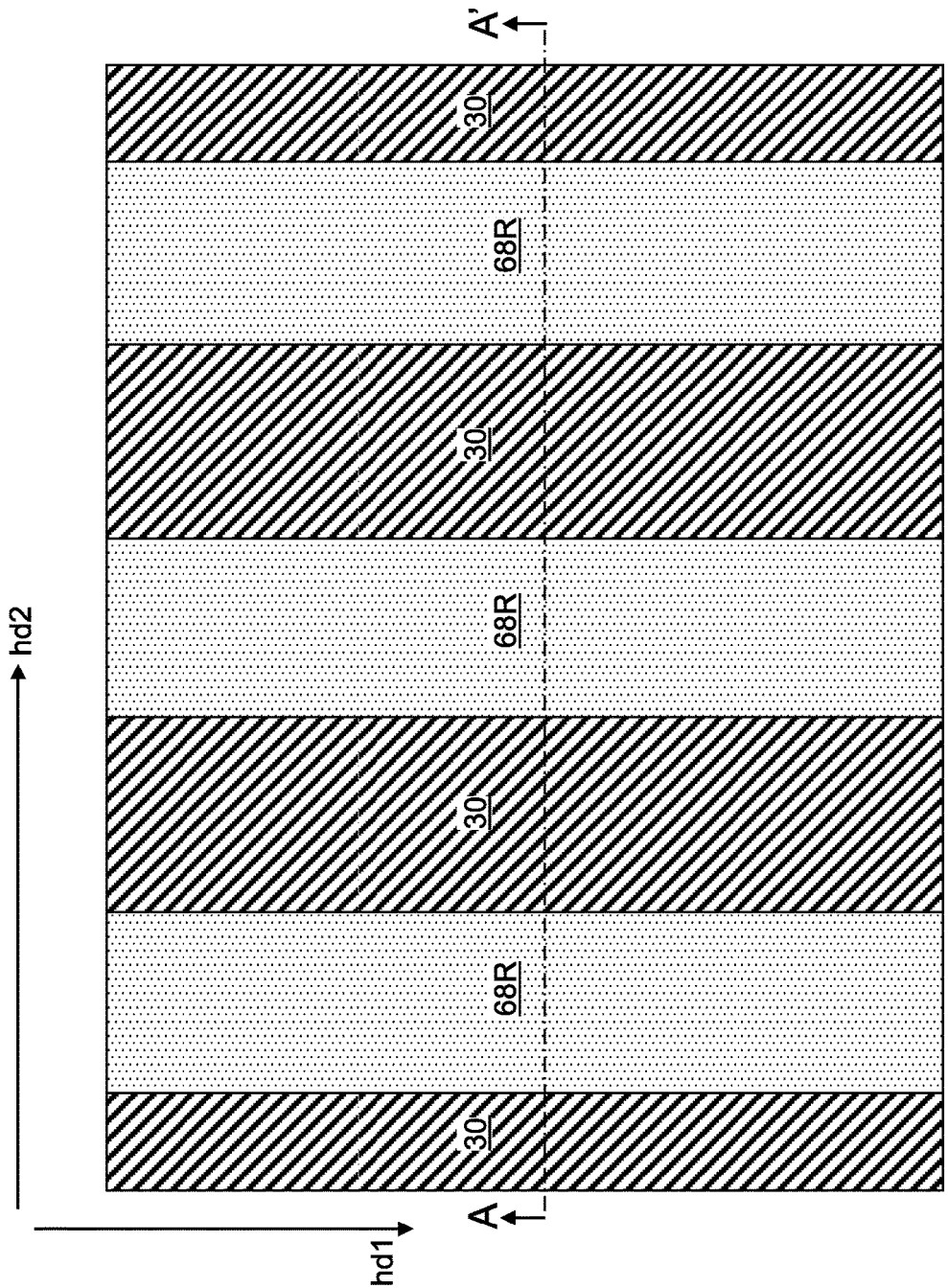
FIG. 14B is a horizontal cross-sectional view of the array region of the exemplary structure of FIG. 14A along the horizontal plane B-B'. The vertical plane A-A' is the plane of the cross-section for FIG. 14A.

Referring to FIGS. 14A and 14B, a dielectric material is deposited to fill the line trenches 49. The dielectric material can be removed from above a horizontal plane including the top surfaces of the insulating cap layers 61. Each remaining portion of the dielectric material filling a line trench 49 constitutes a dielectric rail structure, which is herein referred to as separator rail structures 68R. Each separator rail structure 68R extends along the first horizontal direction hd1. The alternating stacks (30, 60) and the separator rail structures 68R can form a one-dimensional array that extends along the second horizontal direction hd2. In one embodiment, the alternating stacks (30, 60) and the separator rail structures 68R can have a periodicity that is equal to the sum of the width of an alternating stack (30, 60) and the width of a separator rail structure 68R. The separator rail structures 68R includes a dielectric material such as doped silicate glass, undoped silicate glass (e.g., silicon oxide), silicon nitride, organosilicate glass, or porous derivatives thereof. In an illustrative example, the insulating layers 60 can include undoped silicate glass or doped silicate glass, the insulating cap layer 61 can include silicon nitride or a dielectric metal oxide, and the separator rail structures 68R can include doped silicate glass, undoped silicate glass, or organosilicate glass.

Figure 15A:
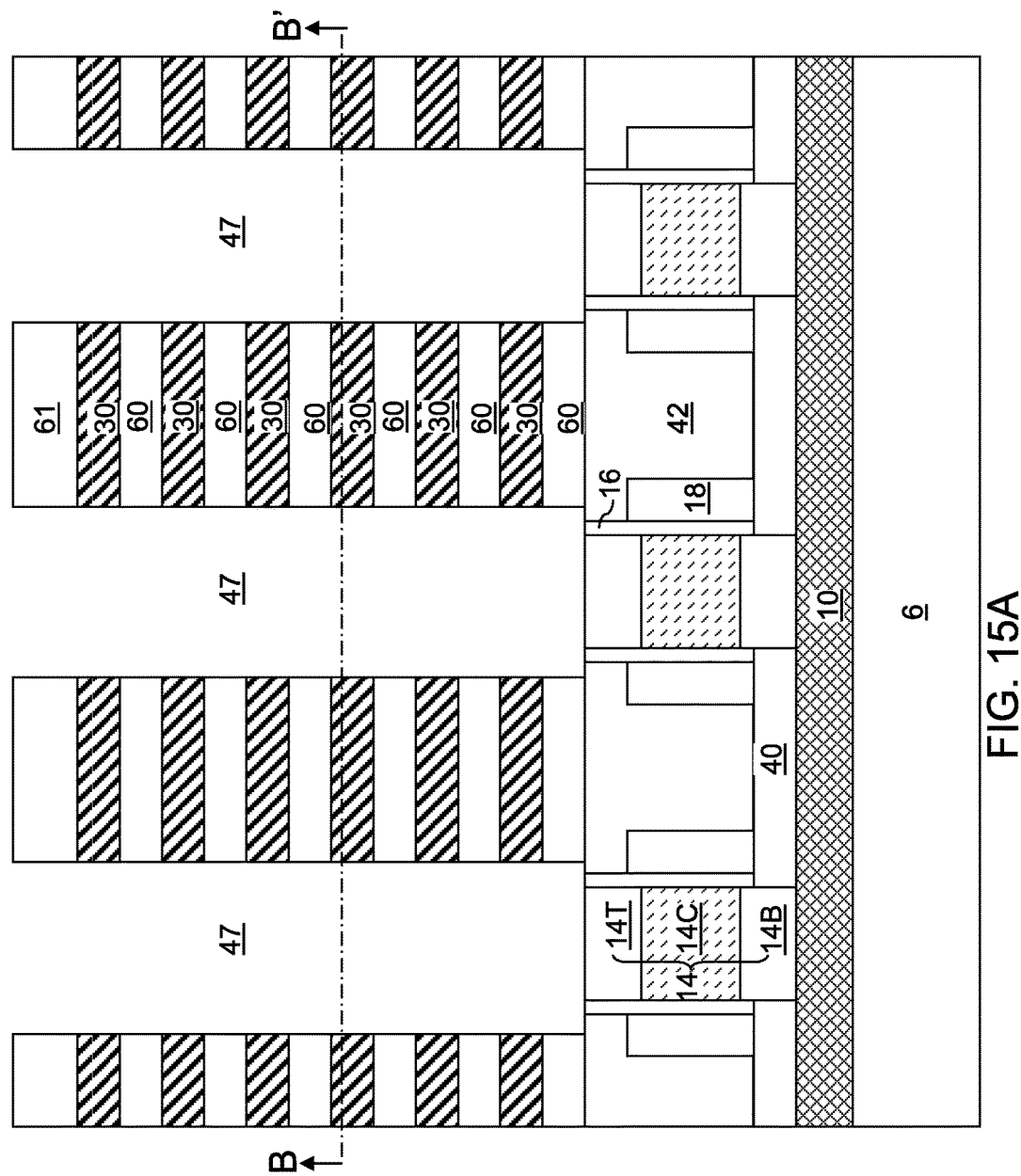
FIG. 15A is a vertical cross-sectional view of the array region of the first exemplary structure after formation of dielectric pillar structures and bit line openings according to an embodiment of the present disclosure.
Figure 15B:
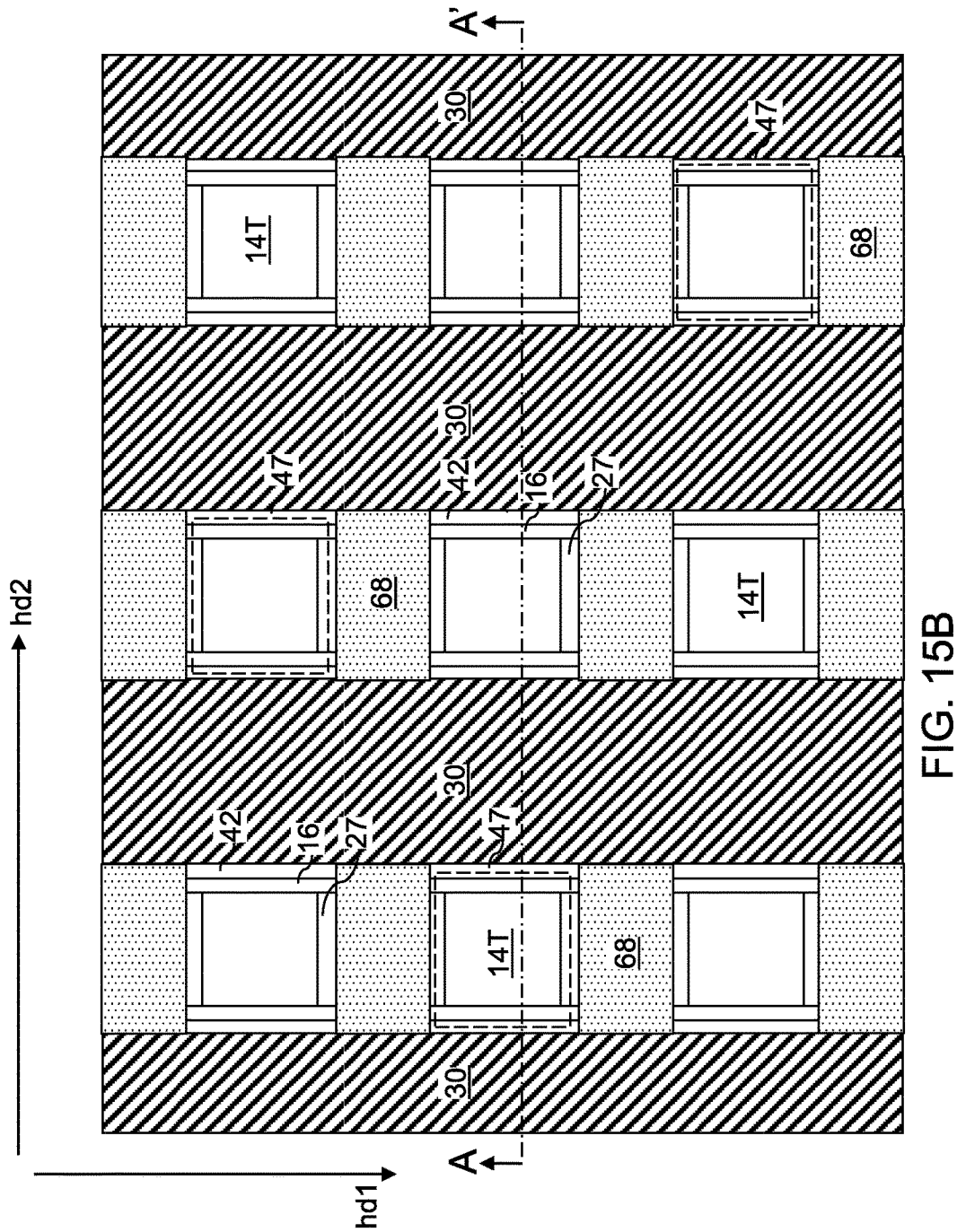
FIG. 15B is a horizontal cross-sectional view of the array region of the exemplary structure of FIG. 15A along the horizontal plane B-B'. The vertical plane A-A' is the plane of the cross-section for FIG. 15A.

Referring to FIGS. 15A and 15B, bit line cavities 47 can be formed by patterning the separator rail structures 68R into separator pillar structures 68. Specifically, a photoresist layer (not shown) can be applied over the insulating cap layer 61 and the separator rail structures 68R, and can be lithographically patterned to form linear portions that overlie areas of the separator dielectric material portions 12. Line trenches extending along the second horizontal direction hd2 and overlying areas of the global bit lines 10 are formed between remaining portions of the photoresist layer.

An anisotropic etch that removes the dielectric material of the separator rail structures 68R selective to the dielectric material of the insulating cap layer 61 can be performed to remove portions of the separator rail structures 68R that are not covered by a combination of the photoresist layer portions and insulating cap layer 61. Bit line cavities 47 having rectangular horizontal cross-sectional areas and extending through the alternating stacks (30, 60) to top surfaces of the top active regions 14T can be formed, thereby separating the separator rail structures 68R into separator pillar structures 68. The bit line cavities 47 can form a two-dimensional rectangular array. The separator pillar structures 68 can form another two-dimensional rectangular array having the same periodicity as the two-dimensional rectangular array of the bit line cavities 47.

While an embodiment in which the area of each bit line cavity 47 is greater than the area of an underlying top active region 14T, embodiments are expressly contemplated herein in which the area of each bit line cavity 47 is substantially the same as, or is less than, the area of an underlying top active region 14T. Further, the geometrical center of each bit line cavity 47 may be located on a vertical line passing through the geometrical center of an underlying vertical stack of a bottom active region 14B, a semiconductor channel 14C, and a top active region 14T, or may be laterally offset from the vertical line due to an overlay variation during the patterning processes employed to form pattern the alternating stacks (30, 60) and the separator pillar structures 68.

Figure 16A:
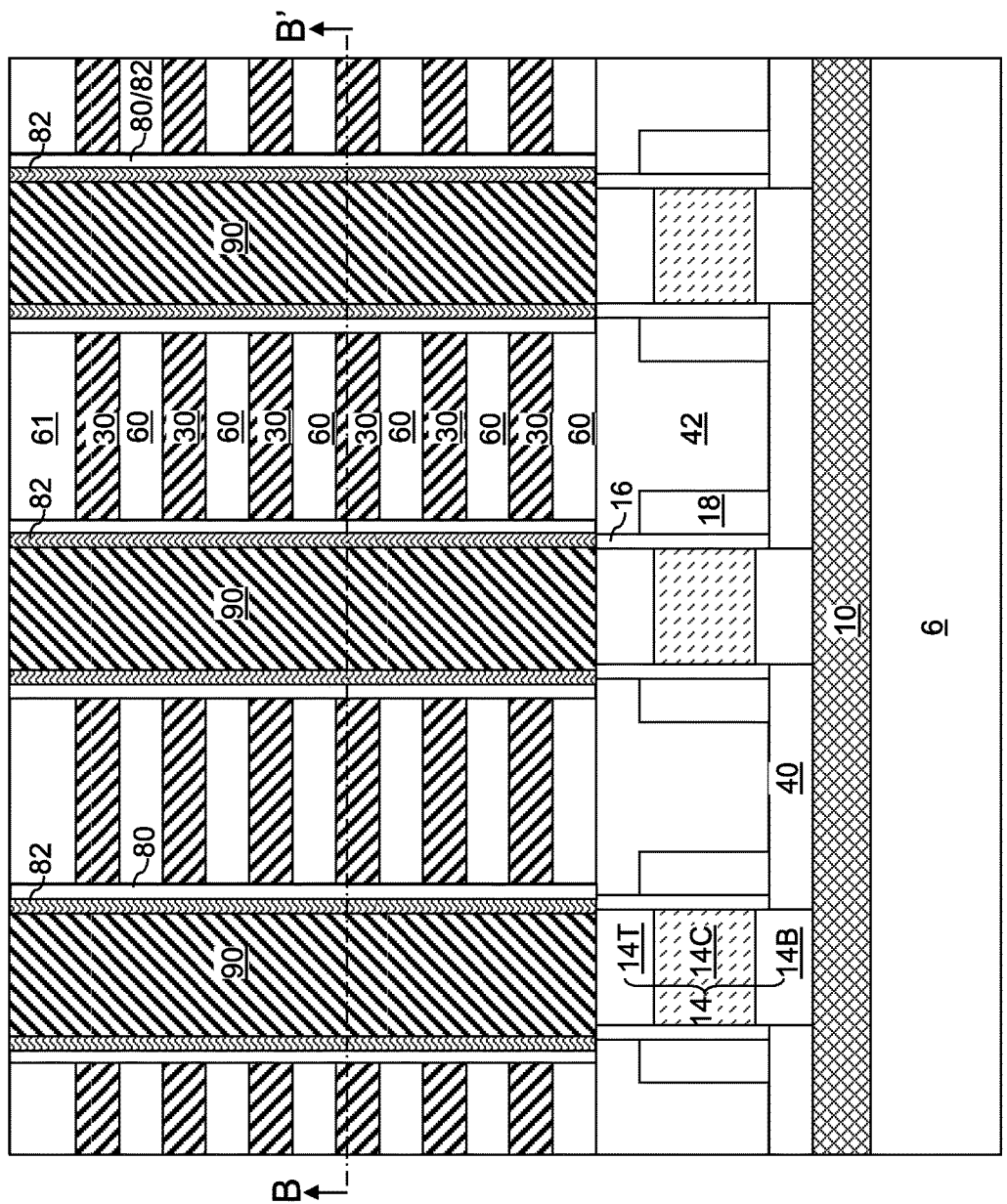
FIG. 16A is a vertical cross-sectional view of the array region of the first exemplary structure after formation of resistive memory layers and bit line structures according to an embodiment of the present disclosure.
Figure 16B:
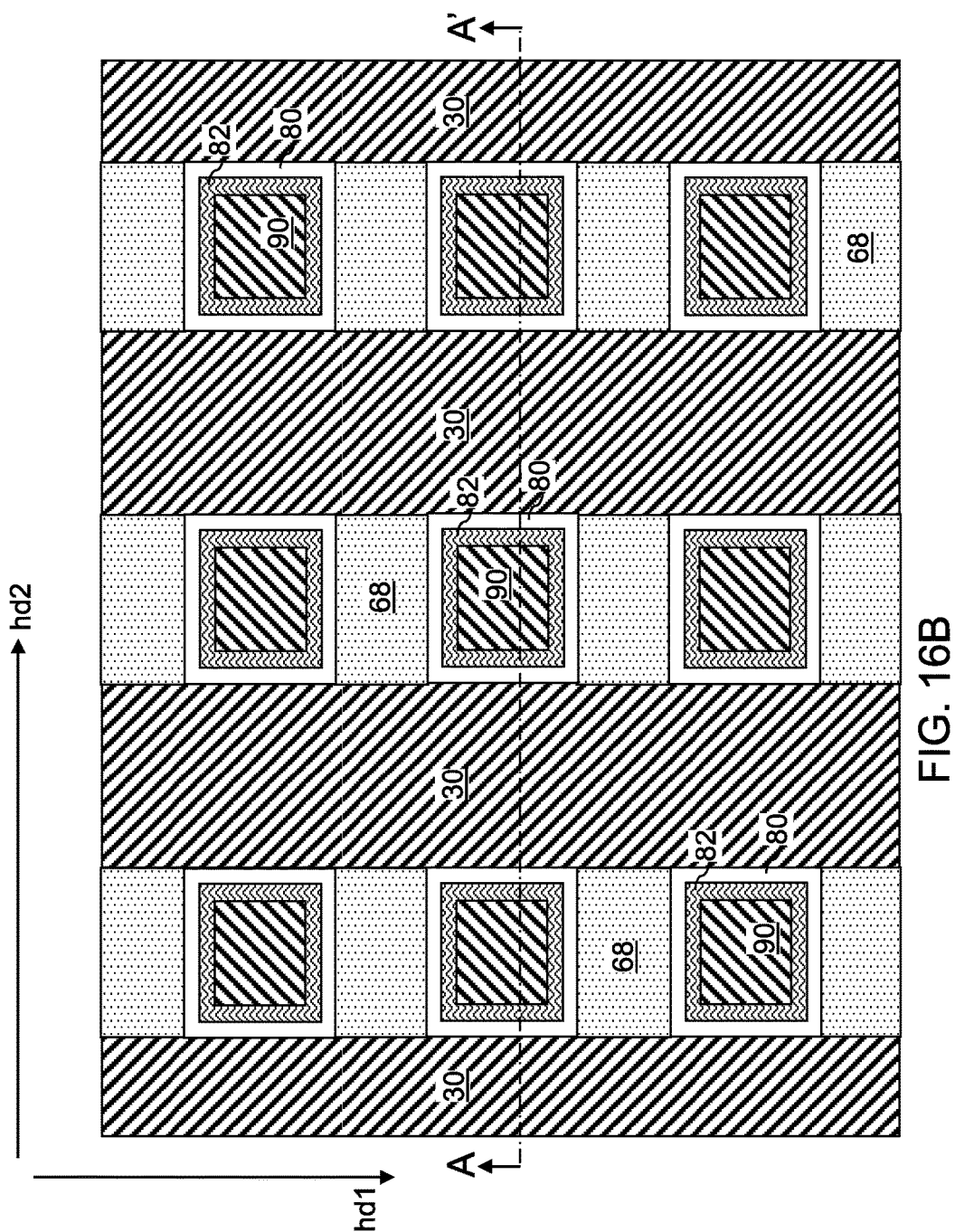
FIG. 16B is a horizontal cross-sectional view of the array region of the exemplary structure of FIG. 16A along the horizontal plane B-B'. The vertical plane A-A' is the plane of the cross-section for FIG. 16A.

Referring to FIGS. 16A and 16B, a resistive memory material layer 80 and an optional steering element layer 82 can be formed on each sidewall of the bit line cavities 47. For example, a continuous resistive memory material layer and a continuous steering element layer can be deposited as continuous layers, and can be anisotropically etched to remove horizontal portions thereof. Each remaining vertical portion of the continuous resistive memory material layer constitutes a resistive memory material layer 80, and each remaining vertical portion of the continuous steering element layer constitutes a steering element layer 82. Each resistive memory material layer 80 can be topologically homeomorphic to a torus, and each steering element layer 82 can be topologically homeomorphic to a torus. As used herein, an element is "topologically homeomorphic to a torus" if the element has a geometrical shape that can be continuously stretched to match a torus without creating or destroying a new hole.

Each resistive memory material layer 80 includes a layer or a layer stack that can provide regions of resistive memory elements. Each resistive memory element includes a resistive memory material. As used he "resistive memory material" or a "reversibly resistance-switching material" is a material of which the resistivity can be altered by application of an electrical bias voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance, such as metal oxide (e.g., titanium oxide or nickel oxide) or chalcogenide element. The resistive memory material layer 80 may optionally include a charge carrier barrier layer or tunneling dielectric. As used herein, a "tunneling dielectric" refers to a dielectric material portion in which the predominant mode of electrical current conduction therethrough is charge carrier tunneling such as electron tunneling or hole tunneling. As used herein, a tunneling dielectric layer a layer including at least one tunneling dielectric. For example, the resistive memory element may include a so-called barrier modulated cell ("BMC") memory element including barrier material (e.g., silicon, germanium, another semiconductor material, etc.) and a charge-modulated resistive memory material (e.g., a metal oxide, such as titanium oxide containing vacancies) for so-called storage class memory ("SCM"). As used herein, a "charge-modulated resistive memory material" refers to a resistive memory material that can have at least two different states of resistivity due to different states of charge distribution, which can be due to ion or vacancy modulation. Thus, the charge-modulated resistive memory materials of the present disclosure include vacancy modulated resistive memory materials that can change the distribution (e.g., location or concentration as function of location) of vacancies therein and ionic resistive memory materials that can change the distribution (e.g., location or concentration as function of location) of ions therein.

As used herein, a "steering element" refers to an element, such as a diode, that provides a non-linear current-voltage characteristic for electrical current passing therethrough. In one embodiment, the steering element may have an asymmetric current-voltage characteristic (e.g., a diode which conducts current primarily in one direction (asymmetric conductance) and which has a lower resistance to the flow of current in one direction, and a higher resistance in the other direction). As used herein, a "steering element layer" refers to a layer including at least one steering element.

The materials that can be employed for the resistive memory material layers 80 depend on the nature of the resist memory elements therein. Specific configurations of the resistive memory elements of the present disclosure are described in separate sections below.

A charge carrier barrier layer, if employed, may comprise a semiconductor material layer, such as an amorphous silicon or polysilicon layer. A tunneling dielectric layer, if employed as a sub-element within a resistive memory material layer 80, can include a dielectric material through which electron tunneling or hole tunneling can occur. In one embodiment, the tunneling dielectric layer includes a dielectric material having a dielectric constant of at least 7.0. For example, the tunneling dielectric layer can include a dielectric material selected from silicon nitride and aluminum oxide. In one embodiment, the thickness of the tunneling dielectric layer can be in a range from 0.6 nm to 4 nm (such as from 1.0 nm to 3 nm), although lesser and greater thicknesses can also be employed.

The steering element layer 82 is optional. Thus, depending on the configuration of specific resistive random access memory, the steering element layer 82 may, or may not, be present. Generally speaking, steering elements known in the art can be optionally employed in conjunction with the resistive memory material layers 80 of the present disclosure.

The steering element layers 82, if employed, can include at least one semiconductor element that provides a non-linear current-voltage characteristic. For example, the steering element layer can include at least one diode therein. In one embodiment, each diode can include a heavily doped n-doped semiconductor region (i.e., n+ region) having n-type dopants at an atomic concentration greater than $5.0 \times 10^{19}/cm^3$, and a lightly or lighter doped p-doped semiconductor region (i.e., p− or p region) including p-type dopants at an atomic concentration less than $5.0 \times 10^{19}/cm^3$. Alternatively, a heavily doped p-doped semiconductor region may be used instead. In one embodiment, the n-doped semiconductor regions can be embodied as discrete n-doped semiconductor material portions. In another embodiment, the n-doped semiconductor regions can be embodied as portions of a continuous n-doped semiconductor material layer. In one embodiment, each n-doped semiconductor region can be incorporated as a portion of a local bit line or electrode. In an alternative embodiment, a p-i-n diode, a Schottky diode or a metal-insulator-metal (MIM) non-linear device is used instead of a p-n diode.

Each stack of a resistive memory material layer 80 and a steering element layer 82 constitutes a memory structure (80, 82) that includes a plurality of vertically stacked memory elements. Each portion of the memory structure (80, 82) located at the levels of the electrically conductive layers 30 constitutes a memory element in which information can be stored in the form of a high resistive state or a low resistive state of the respective portion of the memory structure (80, 82). The total number of memory elements within each memory structure (80, 82) can be the same as the total number of electrically conductive layers 30.

While the present disclosure is described employing an embodiment in which the materials of the resistive memory material layers 80 are deposited first, and the materials of the steering element layers 82 are subsequently deposited, embodiments are expressly contemplated herein in which the order of deposition of the materials is reversed. In this case, outer sidewalls of the steering element layers 82 can contact sidewalls of the alternating stacks (30, 60) and sidewalls of the separator pillar structures 68, and inner sidewalls of the steering element layers 82 can contact outer sidewalls of the resistive memory material layers 80.

At least one conductive material is deposited in each remaining volume of the bit line cavities 47 to form vertical bit lines 90 (e.g., local bit lines). The at least one conductive material can include an elemental metal (e.g., tungsten, titanium, etc.), an intermetallic alloy, a conductive doped semiconductor material, and/or a conductive compound including at least one metal and at least one non-metal element such as a conductive metal nitride (e.g., TiN). Excess portions of the at least one conductive material can be removed from above the top surface of the insulating cap layer 61, for example, by a planarization process (such as chemical mechanical planarization and/or a recess etch).

The electrically conductive layers 30 and the global bit lines 10, and optionally, the vertical bit lines 90 can be suitably electrically wired for operation as a resistive random access memory device. The vertical bit lines 90 electrically contact the top region 14T of the access transistor.

Figure 17A:
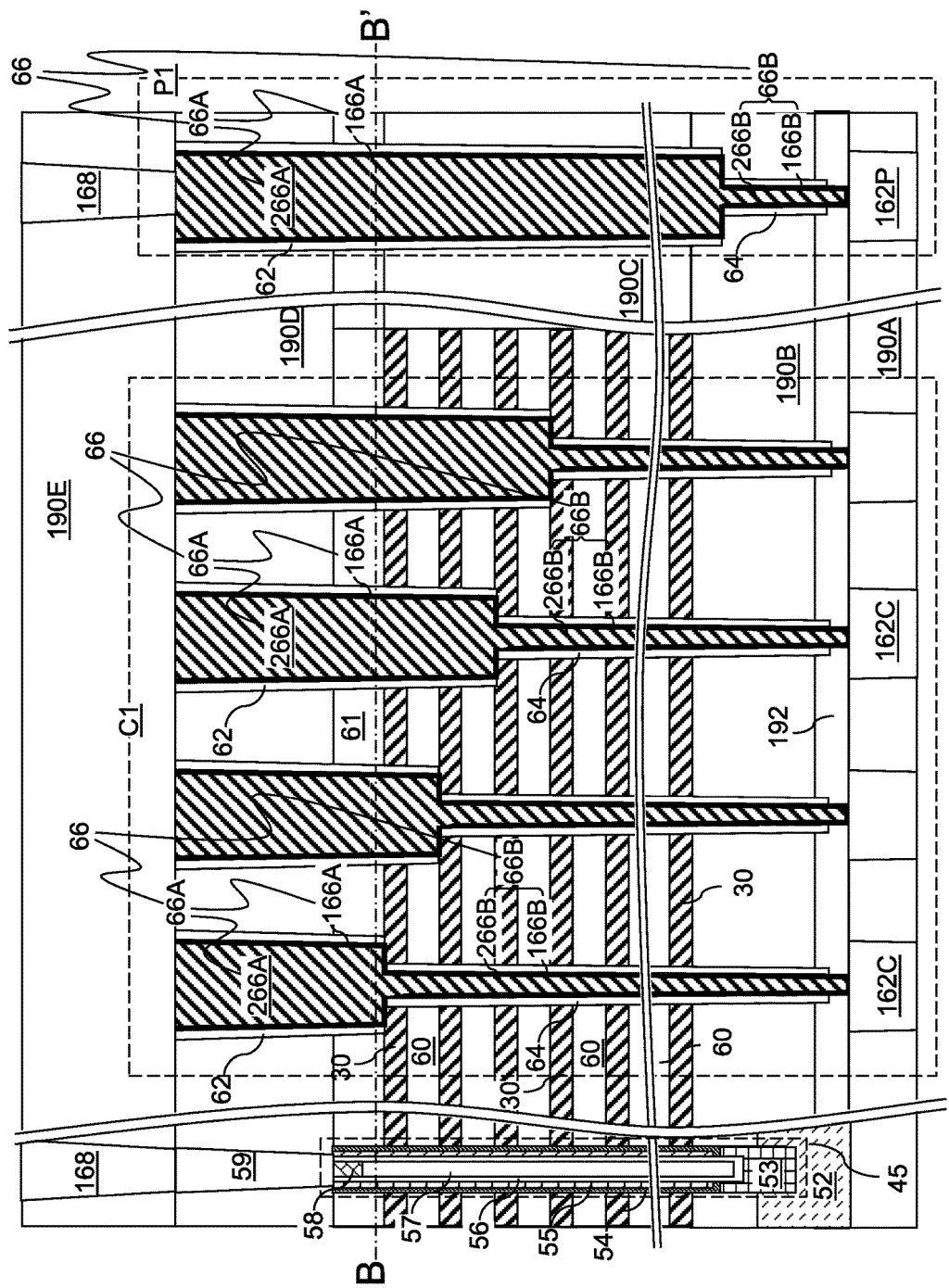
FIG. 17A is a vertical cross-sectional view of an array region, a contact region, and a peripheral device region of a second exemplary structure according to a second embodiment of the present disclosure.
Figure 17B:
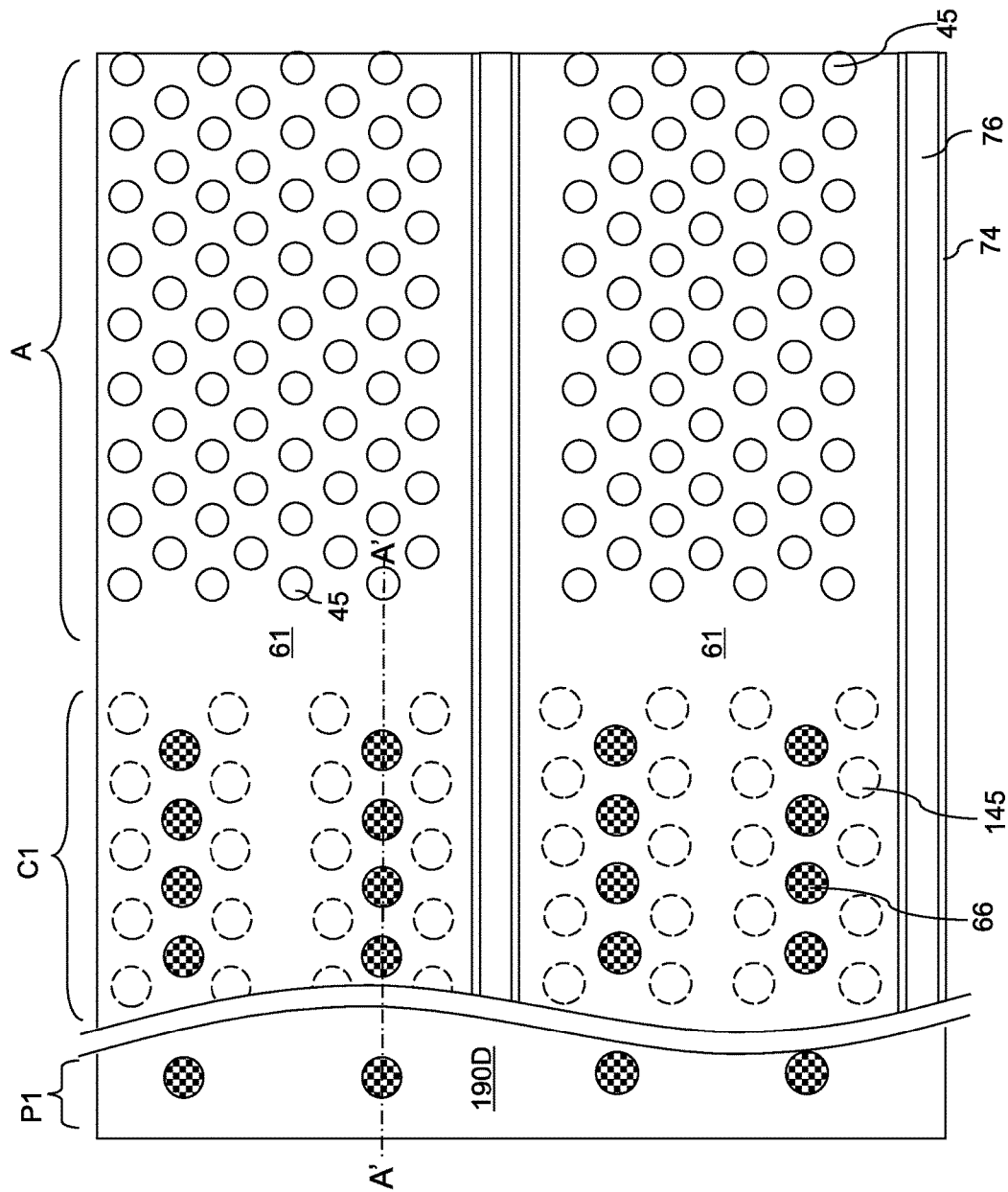
FIG. 17B is a horizontal cross-sectional view of the second exemplary structure of FIG. 17A along the horizontal plane B-B'. The vertical cross-sectional plane A-A' corresponds to the plane of the vertical cross-sectional view of FIG. 17A.

Referring to FIGS. 17A and 17B, a second exemplary structure according to a second embodiment of the present disclosure is illustrated, which can be derived from the first exemplary structure by forming a NAND string as a memory structure instead of a vertical stack of resistive memory elements. A two-dimensional array of NAND strings can be formed within the array region A.

Each NAND string can be formed on a semiconductor material layer 52, which can be a polysilicon layer having a doping of a first conductivity type and including horizontal semiconductor channels (not explicitly shown) that are upper surface portions of the semiconductor material layer 52. Memory openings can be formed through the alternating stack (30, 60). A pillar channel portion 53 can be formed at the bottom of each memory opening by selective deposition of a semiconductor material. A memory film 54 can be formed on the sidewall of each memory opening and on the top surface of each pillar channel portion 53. The memory film 54 can include, from outside to inside, a blocking dielectric layer, a charge storage region or regions (e.g., a charge trapping material layer), and a tunneling dielectric layer. A first semiconductor channel 55 can be formed on the inner sidewall of each memory film 54. The first semiconductor channel 55 can be anisotropically etched to form an opening at the bottom thereof. A second semiconductor channel 56 can be deposited directly on the pillar channel portion 53 and directly on the inner sidewall of the first semiconductor channel 55. A dielectric core 57 can be formed within any cavity that may remain inside the second semiconductor channel 56. A drain region 58 can be formed at an upper end of the first and second semiconductor channels (55, 56). A set of a pillar channel portion 53, a memory film 54, a first semiconductor channel 55, a second semiconductor channel 56, a dielectric core 57 (if present), and drain region 58 collectively constitute a memory structure 45.

Each drain region 58 of the memory structures 45 can be contacted by a drain contact via structure 59. Electrically inactive dummy structures 145 having the same structural components as the memory structures 45 can be formed in the contact region C, which includes the illustrated contact region C1 shown in FIG. 17B. The electrically inactive dummy structures 145 are not contacted by any contact via structures. In some embodiments, backside trenches can be formed. In this case, each backside trench may be filled with an insulating spacer 74 and a backside contact via structure 76.

Each of the first and second exemplary structures and alternative embodiments thereof can include a three-dimensional memory device. The three-dimensional memory device comprises: an alternating stack of insulating layers 60 and electrically conductive layers 30 located over a substrate 110; an array of memory structures {(80, 82) or 45} vertically extending through the alternating stack (30, 60), wherein each of the memory structures {(80, 82) or 45} includes memory elements (e.g., portions of layers 80 or 54) located at levels of the electrically conductive layers 30; conductive structures 162C located between the substrate 110 and the alternating stack (30, 60); and conductive via structures 66, wherein each conductive via structure 66 contacts a top surface of a respective one of the electrically conductive layers 30 and a top surface of a respective one of the conductive structures 162C, and is electrically insulated from a respective subset of the electrically conductive layers 30 that is located between the respective one of the electrically conductive layers 30 and the conductive structures 162C.

For example, the conductive via structures 66 may comprise word line contact via structures which electrically connect each word line 30 of a ReRAM or NAND memory device to a respective peripheral device of a driver circuit, such as a row decoder contact or electrode 162C, located below the alternating stack.

In one embodiment, each conductive via structure 66 comprises: an upper conductive via portion 66A located directly on, and over, the top surface of the respective one of the electrically conductive layers 30; and a lower conductive via portion 66B located between a horizontal plane including the top surface of the respective one of the electrically conductive layers 30 and a horizontal plane including the top surface of the respective one of the conductive structures 162C. In one embodiment, the upper conductive via portion 66A has a greater width than the lower conductive via portion 66B. In one embodiment, each upper conductive via portion 66A is laterally surrounded by a respective upper insulating spacer 62; each lower conductive via portion 66B is laterally surrounded by a respective lower insulating spacer 64; and the upper and lower insulating spacers (62, 64) comprise a same dielectric material.

In one embodiment, each conductive via structure 66 comprises: a metallic liner (166A, 166B) including a first vertical portion overlying the top surface of the respective one of the electrically conductive layers 30, a horizontal portion physically contacting the top surface of the respective one of the electrically conductive layers 30, and a second vertical portion extending between the top surface of the respective one of the electrically conductive layers 30 and the top surface of the respective one of the conductive structures 162C; and a conductive fill material portion (266A, 266B) comprising a first conductive fill material sub-portion 266A overlying a horizontal plane including the top surface of the respective one of the electrically conductive layers 30 and a second conductive fill material sub-portion 266B underlying the horizontal plane including the top surface of the respective one of the electrically conductive layers 30. In one embodiment, an inner periphery of a physical contact area between the metallic liner (166A, 166B) and the top surface of the respective one of the electrically conductive layers 30 is spaced from an outer periphery of the physical contact area by a uniform lateral distance. In one embodiment, the contact via structures 66 have top surfaces located within a first horizontal plane (which can be the plane including an interface between the third memory level dielectric material layer 190D and the first upper interconnect level dielectric material layer 210A); the conductive structures 162C have top surface located within a second horizontal plane; and the horizontal portions of the metallic liners are located at different levels among the contact via structures 66 (corresponding to the different level of the electrically conductive layers 30 that each contact via structure 66 physically contacts).

In one embodiment, the electrically conductive layers 30 are in a configuration that provides a contact region in which each electrically conductive layer 30 that is not a bottommost electrically conductive layer 30 has a lesser area than any underlying electrically conductive layer 30 among the electrically conductive layers 30; and each conductive via structure 66 physically contacts the top surface of the respective one of the electrically conductive layers 30 within a respective area in which none of the electrically conductive layers 30 overlies the respective one of the electrically conductive layers 30. In one embodiment, the three-dimensional memory device can include a memory level dielectric material portion 190C that contacts horizontal surfaces and sidewalls of the electrically conductive layers 30 within the contact region C, wherein each conductive via structure 66 vertically extends at least from a topmost surface of the memory level dielectric material portion 190C to the top surface of the respective one of the electrically conductive layers 30.

In one embodiment, an etch stop dielectric layer 192 can be provided, which contacts the top surfaces of the conductive structures 162C, wherein each conductive via structure 66 is electrically insulated from the respective subset of the electrically conductive layers 30 that is located between the respective one of the electrically conductive layers 30 and the conductive structures 162C by a respective insulating spacer 64 and contacts a respective sidewall of the etch stop dielectric layer 192.

In some embodiments, as illustrated in the first exemplary structure, the three-dimensional memory device comprises a vertical bit line containing resistive random access memory device. The device may include barrier modulated cells (portions of the memory structures (80, 82) that are located at levels of the electrically conductive layers 30) as memory elements; and each of the barrier modulated cells comprises a semiconductor material portion and a dielectric metal oxide portion including oxygen vacancies.

In some embodiments, as illustrated in the second exemplary structure, the three-dimensional memory device comprises a monolithic three-dimensional NAND memory device; the electrically conductive layers 30 comprise, or are electrically connected to, a respective word line of the monolithic three-dimensional NAND memory device; the substrate 110 comprises a silicon substrate; the monolithic three-dimensional NAND memory device comprises an array of monolithic three-dimensional NAND strings over the silicon substrate; at least one memory cell in a first device level of the array of monolithic three-dimensional NAND strings is located over another memory cell in a second device level of the array of monolithic three-dimensional NAND strings (to provide a vertically stacked configuration); the silicon substrate contains an integrated circuit comprising a driver circuit for the memory device located thereon; the electrically conductive layers 30 comprise a plurality of control gate electrodes having a strip shape extending substantially parallel to the top surface of the substrate, the plurality of control gate electrodes comprise at least a first control gate electrode located in the first device level and a second control gate electrode located in the second device level. The array of monolithic three-dimensional NAND strings can comprise: a plurality of semiconductor channels (55, 56), wherein at least one end portion of each of the plurality of semiconductor channels (55, 56) extends substantially perpendicular to a top surface of the substrate 110, and a plurality of charge storage elements, each charge storage element located adjacent to a respective one of the plurality of semiconductor channels (55, 56).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate;
   an array of memory structures vertically extending through the alternating stack, wherein each of the memory structures includes memory elements located at levels of the electrically conductive layers;
   conductive structures located between the substrate and the alternating stack; and
   conductive via structures, wherein each conductive via structure contacts a top surface of a respective one of the electrically conductive layers and a top surface of a respective one of the conductive structures, and is electrically insulated from a respective subset of the electrically conductive layers that is located between the respective one of the electrically conductive layers and the conductive structures,
   wherein each conductive via structure comprises an upper conductive via portion located directly on, and over, the top surface of the respective one of the electrically conductive layers, and a lower conductive via portion located between a horizontal plane including the top surface of the respective one of the electrically conductive layers and a horizontal plane including the top surface of the respective one of the conductive structures; and
   wherein:
      each upper conductive via portion is laterally surrounded by a respective upper insulating spacer;
      each lower conductive via portion is laterally surrounded by a respective lower insulating spacer; and
      the upper and lower insulating spacers comprise a same dielectric material.

2. The three-dimensional memory device of claim 1, wherein the upper conductive via portion has a greater width than the lower conductive via portion.

3. The three-dimensional memory device of claim 1, wherein:
   the electrically conductive layers are in a configuration that provides a contact region in which each electrically conductive layer that is not a bottommost electrically conductive layer has a lesser area than any underlying electrically conductive layer among the electrically conductive layers; and
   each conductive via structure physically contacts the top surface of the respective one of the electrically conductive layers within a respective area in which none of the electrically conductive layers overlies the respective one of the electrically conductive layers.

4. The three-dimensional memory device of claim 1, wherein the three-dimensional memory device comprises a vertical bit line containing resistive random access memory device.

5. The three-dimensional memory device of claim 1, wherein the three-dimensional memory device comprises a monolithic three-dimensional NAND memory device.

6. The three-dimensional memory device of claim 1, wherein:
   the conductive via structures comprise word line contact via structures;

the electrically conductive layers comprise word lines of the three dimensional memory device; and
the conductive via structures electrically connect each word line to a respective peripheral device of a driver circuit located below the alternating stack.

7. A three-dimensional memory device comprising:
an alternating stack of insulating layers and electrically conductive layers located over a substrate;
an array of memory structures vertically extending through the alternating stack, wherein each of the memory structures includes memory elements located at levels of the electrically conductive layers;
conductive structures located between the substrate and the alternating stack; and
conductive via structures, wherein each conductive via structure contacts a top surface of a respective one of the electrically conductive layers and a top surface of a respective one of the conductive structures, and is electrically insulated from a respective subset of the electrically conductive layers that is located between the respective one of the electrically conductive layers and the conductive structures,
wherein each conductive via structure comprises:
a metallic liner including a first vertically extending portion overlying the top surface of the respective one of the electrically conductive layers, a horizontal portion physically contacting the top surface of the respective one of the electrically conductive layers, and a second vertically extending portion extending between the top surface of the respective one of the electrically conductive layers and the top surface of the respective one of the conductive structures; and
a conductive fill material portion comprising a first conductive fill material sub-portion overlying a horizontal plane including the top surface of the respective one of the electrically conductive layers and a second conductive fill material sub-portion underlying the horizontal plane including the top surface of the respective one of the electrically conductive layers.

8. The three-dimensional memory device of claim 7, wherein an inner periphery of a physical contact area between the metallic liner and the top surface of the respective one of the electrically conductive layers is spaced from an outer periphery of the physical contact area by a uniform lateral distance.

9. The three-dimensional memory device of claim 7, wherein:
the conductive via structures have top surfaces located within a first horizontal plane;
the conductive structures have top surfaces located within a second horizontal plane; and
the horizontal portions of the metallic liners are located at different levels among the contact via structures.

10. The three-dimensional memory device of claim 9, further comprising a memory level dielectric material portion that contacts horizontal surfaces and sidewalls of the electrically conductive layers within the contact region, wherein each conductive via structure vertically extends at least from a topmost surface of the memory level dielectric material portion to the top surface of the respective one of the electrically conductive layers.

11. A method of forming a three-dimensional memory device, comprising:
forming conductive structures over a substrate;
forming an alternating stack of insulating layers and spacer material layers over the conductive structures, wherein the spacer material layers are formed as, or are subsequently replaced with, electrically conductive layers;
forming an array of memory structures through the alternating stack, wherein each of the memory structures includes memory elements located at levels of the electrically conductive layers;
forming conductive via structures on the electrically conductive layers, wherein each conductive via structure is formed directly on a top surface of a respective one of the electrically conductive layers and directly on a top surface of a respective one of the conductive structures, and is electrically insulated from a respective subset of the electrically conductive layers that is located between the respective one of the electrically conductive layers and the conductive structures;
patterning the spacer material layers to form a contact region in which each spacer material layer that is not a bottommost spacer material layer has a lesser area than any underlying spacer material layer within the spacer material layers, wherein the conductive via structures are formed on horizontal surfaces of the electrically conductive layers within the contact region;
forming a memory level dielectric material portion over the contact region, wherein each conductive via structure is formed through the memory level dielectric material portion;
forming upper contact via cavities through the memory level dielectric material portion by a first anisotropic etch process, wherein top surfaces of the electrically conductive layers are physically exposed at a bottom of each of the upper contact via cavities;
forming sacrificial spacers at a periphery of each of the upper contact via cavities; and
forming lower contact via cavities through a subset of the electrically conductive layers that underlie the sacrificial spacers by a second anisotropic etch process.

12. The method of claim 11, further comprising:
removing the sacrificial spacers;
depositing a conformal dielectric material layer in the upper contact via cavities and in the lower contact via cavities as a continuous material layer;
forming upper insulating spacers and lower insulating spacers in the upper contact via cavities and in the lower contact via cavities, respectively, by anisotropically etching the conformal dielectric material layer, wherein the contact via structures are formed in remaining volumes of the upper contact via cavities and the lower contact via cavities.

13. A method of forming a three-dimensional memory device, comprising:
forming conductive structures over a substrate;
forming an alternating stack of insulating layers and spacer material layers over the conductive structures, wherein the spacer material layers are formed as, or are subsequently replaced with, electrically conductive layers;
forming an array of memory structures through the alternating stack, wherein each of the memory structures includes memory elements located at levels of the electrically conductive layers;
forming conductive via structures on the electrically conductive layers, wherein each conductive via structure is formed directly on a top surface of a respective one of the electrically conductive layers and directly on a top surface of a respective one of the conductive structures, and is electrically insulated from a respective subset of the electrically conductive layers that is located between the respective one of the electrically conductive layers and the conductive structures;

forming contact via cavities through a dielectric material portion overlying the electrically conductive layers and through the alternating stack to top surfaces of the conductive structures;

forming upper insulating spacers in upper portions of the contact via cavities overlying the alternating stack and lower insulating spacers in lower portions of the contact via cavities extending through the alternating stack, wherein the lower insulating spacers do not physically contact the upper insulating spacers; and depositing at least one conductive material within the upper insulating spacers and lower insulating spacers to form the conductive via structures.

14. A method of forming a three-dimensional memory device, comprising:

forming conductive structures over a substrate;

forming an alternating stack of insulating layers and spacer material layers over the conductive structures, wherein the spacer material layers are formed as, or are subsequently replaced with, electrically conductive layers;

forming an array of memory structures through the alternating stack, wherein each of the memory structures includes memory elements located at levels of the electrically conductive layers; and forming conductive via structures on the electrically conductive layers, wherein each conductive via structure is formed directly on a top surface of a respective one of the electrically conductive layers and directly on a top surface of a respective one of the conductive structures, and is electrically insulated from a respective subset of the electrically conductive layers that is located between the respective one of the electrically conductive layers and the conductive structures, wherein each conductive via structure comprises:

a metallic liner including a first vertically extending portion overlying the top surface of the respective one of the electrically conductive layers, a horizontal portion physically contacting the top surface of the respective one of the electrically conductive layers, and a second vertically extending portion extending between the top surface of the respective one of the electrically conductive layers and the top surface of the respective one of the conductive structures; and a conductive fill material portion comprising a first conductive fill material sub-portion overlying a horizontal plane including the top surface of the respective one of the electrically conductive layers and a second conductive fill material sub-portion underlying the horizontal plane including the top surface of the respective one of the electrically conductive layers.

15. The method of claim 14, wherein an inner periphery of a physical contact area between the metallic liner and the top surface of the respective one of the electrically conductive layers is spaced from an outer periphery of the physical contact area by a uniform lateral distance.

* * * * *